United States Patent
Hong et al.

(10) Patent No.: US 9,171,960 B2
(45) Date of Patent: Oct. 27, 2015

(54) METAL OXIDE LAYER COMPOSITION CONTROL BY ATOMIC LAYER DEPOSITION FOR THIN FILM TRANSISTOR

(71) Applicant: QUALCOMM MEMS Technologies, Inc., San Diego, CA (US)

(72) Inventors: John Hyunchul Hong, San Clemente, CA (US); Hong-Son Ryang, Camarillo, CA (US); Cheonhong Kim, San Diego, CA (US); Tze-Ching Fung, San Diego, CA (US)

(73) Assignee: QUALCOMM MEMS Technologies, Inc., San Diego, CA (US)

( * ) Notice: Subject to any disclaimer, the term of this patent is extended or adjusted under 35 U.S.C. 154(b) by 58 days.

(21) Appl. No.: 13/750,959

(22) Filed: Jan. 25, 2013

(65) Prior Publication Data
US 2014/0210835 A1    Jul. 31, 2014

(51) Int. Cl.
*H01L 29/786* (2006.01)
*G09G 3/20* (2006.01)
*H01L 29/66* (2006.01)
(Continued)

(52) U.S. Cl.
CPC ............ *H01L 29/78693* (2013.01); *G09G 3/20* (2013.01); *H01L 21/02505* (2013.01); *H01L 21/823807* (2013.01); *H01L 29/6675* (2013.01); *H01L 29/78696* (2013.01); *H01L 21/0251* (2013.01); *H01L 29/1054* (2013.01)

(58) Field of Classification Search
CPC .................. H01L 29/78696; H01L 29/66969; H01L 29/786; H01L 29/7869; H01L 21/0228; H01L 21/02538; H01L 21/02521; H01L 27/1225
USPC .......................................................... 257/43
See application file for complete search history.

(56) References Cited

U.S. PATENT DOCUMENTS 6,933,225 B2    8/2005   Werkhoven et al.
6,969,690 B2    11/2005  Zhou et al.
(Continued)

FOREIGN PATENT DOCUMENTS

JP    H07-230099 A    8/1995
WO   2011139774       11/2011

OTHER PUBLICATIONS

ISA International Search Report and Written Opinion in PCT/US2014/011890, dated May 20, 2014, 13 pages.
(Continued)

*Primary Examiner* — Jesse Y Miyoshi
*Assistant Examiner* — David Spalla
(74) *Attorney, Agent, or Firm* — Weaver Austin Villeneuve & Sampson LLP

(57) ABSTRACT

This disclosure provides systems, methods and apparatus for a thin film transistor (TFT) device on a substrate. In one aspect, the TFT device includes a gate electrode, an oxide semiconductor layer, and a gate insulator between the gate electrode and the oxide semiconductor layer. The oxide semiconductor layer includes at least two metal oxides, with the two metal oxides having a varying concentration relative to one another between a lower surface and an upper surface of the oxide semiconductor layer. The TFT device also includes a source metal adjacent to a portion of the oxide semiconductor layer and a drain metal adjacent to another portion of the oxide semiconductor layer. The composition of the oxide semiconductor layer can be precisely controlled by a sequential deposition technique using atomic layer deposition (ALD).

24 Claims, 9 Drawing Sheets

(51) Int. Cl.
*H01L 21/8238* (2006.01)
*H01L 21/02* (2006.01)
*H01L 29/10* (2006.01)

(56) References Cited

U.S. PATENT DOCUMENTS

| | | |
|---|---|---|
| 7,670,894 B2 | 3/2010 | Rachmady et al. |
| 8,110,469 B2 | 2/2012 | Gealy et al. |
| 8,247,162 B2 | 8/2012 | Park et al. |
| 2008/0277658 A1 | 11/2008 | Lee et al. |
| 2008/0296567 A1* | 12/2008 | Irving et al. ............... 257/43 |
| 2008/0299771 A1 | 12/2008 | Irving et al. |
| 2010/0059747 A1 | 3/2010 | Nakayama et al. |
| 2010/0181565 A1 | 7/2010 | Sakata et al. |
| 2010/0276682 A1* | 11/2010 | Yeh et al. .................. 257/43 |
| 2011/0140095 A1 | 6/2011 | Kim et al. |
| 2011/0140100 A1* | 6/2011 | Takata et al. ............... 257/43 |
| 2011/0141076 A1 | 6/2011 | Fukuhara et al. |
| 2011/0315980 A1* | 12/2011 | Kim ......................... 257/43 |
| 2012/0088369 A1 | 4/2012 | Weidman et al. |
| 2012/0132905 A1 | 5/2012 | Yamazaki |
| 2013/0146868 A1* | 6/2013 | Zan et al. .................. 257/43 |
| 2014/0140100 A1* | 5/2014 | Lv et al. .................... 362/627 |

OTHER PUBLICATIONS

Elam J.W., et al., "Atomic Layer Deposition of In2O3 Using Cyclopentadienyl Indium: A New Synthetic Route to Transparent Conducting Oxide Films," 2006 American Chemical Society, Chem. Mater. 2006, vol. 18, pp. 3571-3578.

Elam J.W., et al., "Atomic Layer Deposition of Indium Tin Oxide Thin Films Using Nonhalogenated Precursors", The Journal of Physical Chemistry, 2008, pp. 1938-1945, vol. 112, American Chemical Society.

Kotha R., et al., "Atomic Layer Deposited (ALD) Zinc Oxide film characterization for NEMS and MEMS", EDA Publishing/DTIP 2010, 2010 Symposium on Design Test Integration and Packaging of MEMS/MOEMS (DTIP), May 5-7, 2010, Seville, Spain, pp. 185-189.

Nomura, K., et al., "Room-temperature Fabrication of Transparent Flexible Thin-File Transistors Using Amorphous Oxide Semiconductors," Nature Publishing Group, Nov. 25, 2004, vol. 432, pp. 488-492.

Shan F.K., et al., "Structural, electrical, and optical properties of transparent gallium oxide thin films grown by plasma-enhanced atomic layer deposition", Journal of Applied Physics, 2005, pp. 1-7, vol. 98.

* cited by examiner

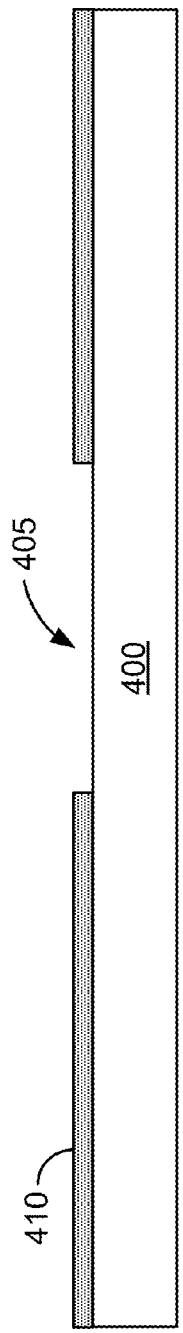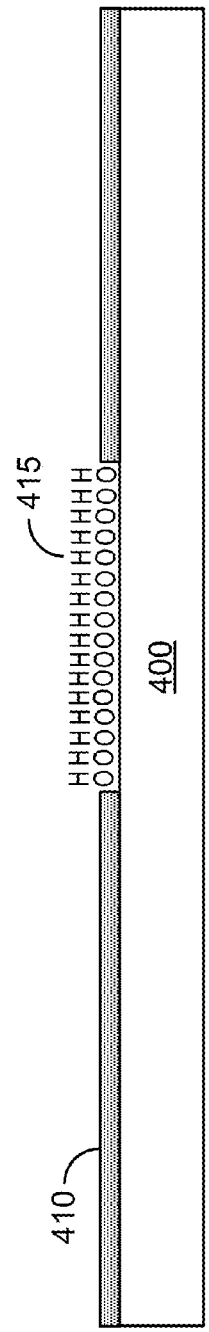
Figure 4A
Figure 4B

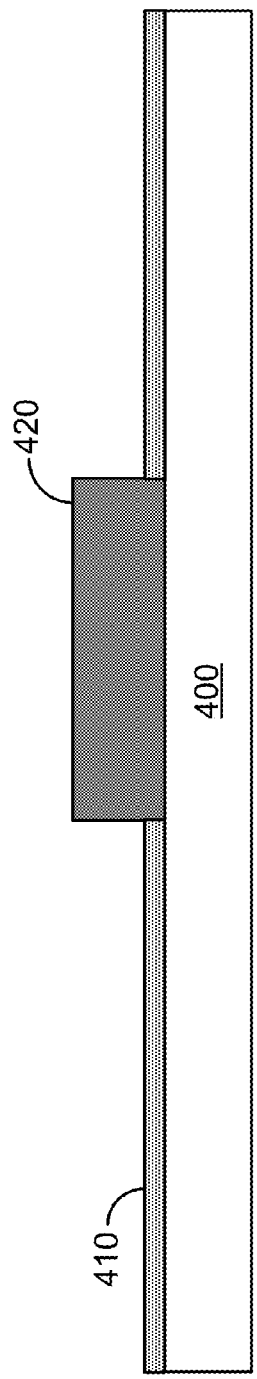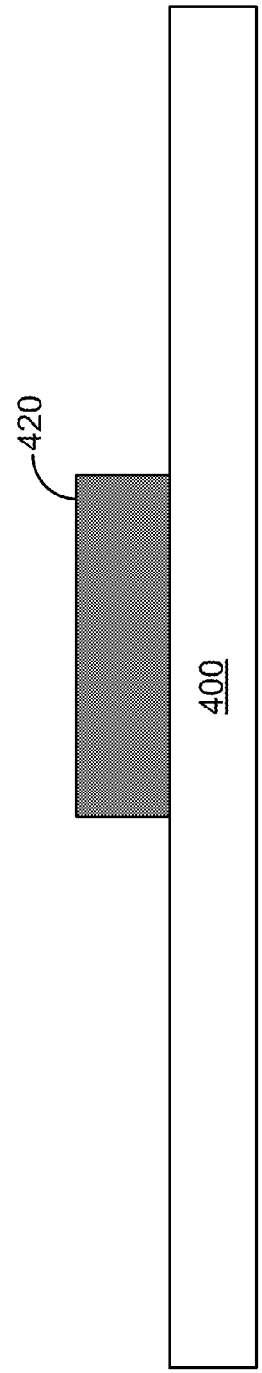

METAL OXIDE LAYER COMPOSITION CONTROL BY ATOMIC LAYER DEPOSITION FOR THIN FILM TRANSISTOR

TECHNICAL FIELD

This disclosure relates to fabrication of metal oxide layers and more particularly to fabrication methods for metal oxide semiconductor layers for thin film transistor devices.

DESCRIPTION OF THE RELATED TECHNOLOGY

Electromechanical systems (EMS) include devices having electrical and mechanical elements, actuators, transducers, sensors, optical components such as mirrors and optical films, and electronics. EMS devices or elements can be manufactured at a variety of scales including, but not limited to, microscales and nanoscales. For example, microelectromechanical systems (MEMS) devices can include structures having lateral sizes ranging from about a micron to hundreds of microns or more. Nanoelectromechanical systems (NEMS) devices can include structures having sizes smaller than a micron including, for example, sizes smaller than several hundred nanometers. Electromechanical elements may be created using deposition, etching, lithography, and/or other micromachining processes that etch away parts of substrates and/or deposited material layers, or that add layers to form electrical and electromechanical devices.

One type of EMS device is called an interferometric modulator (IMOD). The term IMOD or interferometric light modulator refers to a device that selectively absorbs and/or reflects light using the principles of interferometric absorption. In some implementations, an IMOD display element may include a pair of conductive plates, one or both of which may be transparent, reflective, and/or absorptive, wholly or in part, and capable of relative motion upon application of an appropriate electrical signal. For example, one plate may include a stationary layer deposited over, on or supported by a substrate and the other plate may include a reflective membrane separated from the stationary layer by an air gap. The gap between the thin absorbing conductor and the reflective mirror causes spectrally selective absorption of the optical energy to take place in the absorbing layer, thereby modifying the spectrum of the reflected light. Incident white light, for example, can be reflected as colored light. IMOD-based display devices have a wide range of applications, and are anticipated to be used in improving existing products and creating new products, especially those with display capabilities.

Hardware and data processing apparatus may be associated with electromechanical systems. Such hardware and data processing apparatus may include a thin film transistor (TFT) device. A TFT device is a kind of field-effect transistor that includes a source region, a drain region, and a channel region in a semiconducting material.

SUMMARY

The systems, methods and devices of this disclosure each have several innovative aspects, no single one of which is solely responsible for the desirable attributes disclosed herein.

One innovative aspect of the subject matter described in this disclosure can be implemented in a TFT device. The TFT device includes a gate, an active layer having a source region, a drain region, and a channel region, where the channel region is between the source region and the drain region, and where the active layer includes at least two metal oxides, the at least two metal oxides having a varying concentration relative to one another between a lower surface and an upper surface of the active layer. The TFT device also includes a gate insulator between the active layer and the gate, a source metal adjacent to the source region of the active layer, and a drain metal adjacent to the drain region of the active layer.

In some implementations, the gate is over the gate insulator and the active layer is below the gate insulator. In some implementations, the gate is below the gate insulator and the active layer is over the gate insulator. In some implementations, the active layer substantially includes a substantially semiconducting metal oxide proximate the interface between the active layer and the gate insulator. In some implementations, the active layer includes indium-gallium-zinc-oxide (IGZO). The concentration of gallium oxide can increase from a surface of the active layer facing away from the gate to a surface of the active layer facing towards the gate. The concentration of gallium oxide can be less than about 5% at the surface of the active layer facing away from the gate and greater than about 95% at the surface of the active layer facing towards the gate. In some implementations, the active layer can be amorphous. In some implementations, the active layer can be less than about 100 Å in thickness.

Another innovative aspect of the subject matter described in this disclosure can be implemented in a method. The method includes providing a substrate; depositing by atomic layer deposition (ALD) a first metal oxide in a first deposition cycle; depositing by ALD a second metal oxide in a second deposition cycle; and forming a multi-component metal oxide semiconductor thin film on the substrate over a plurality of first deposition cycles and second deposition cycles in a deposition sequence, where the first deposition cycles occur with increasing frequency during the deposition sequence.

In some implementations, depositing the first metal oxide includes pulsing a first metal precursor over the substrate and pulsing an oxidant precursor over the first metal precursor to form the first metal oxide. Depositing the second metal oxide includes pulsing a second metal precursor over the substrate and pulsing an oxidant precursor over the second metal precursor to form the second metal oxide. In some implementations, providing the substrate includes pre-patterning the substrate with a hydrophobic photoresist, the hydrophobic photoresist having one or more openings to expose portions of the substrate such that the multi-component oxide semiconductor thin film is formed in the exposed portions of the substrate. Depositing the first metal oxide or depositing the second metal oxide includes selectively depositing the first metal oxide or the second metal oxide on the exposed portions of the substrate.

Another innovative aspect of the subject matter described in this disclosure can be implemented in an apparatus. The apparatus includes a substrate and a thin film transistor (TFT) over the substrate. The TFT includes a gate metal over the substrate, a dielectric layer over the substrate and the gate metal, an oxide semiconductor layer over the dielectric layer, where the oxide semiconductor layer has a source region, a drain region, and a channel region such that the channel region is between the source region and the drain region, a source metal adjacent to the source region of the oxide semiconductor layer, and a drain metal adjacent to the drain region of the oxide semiconductor layer. The oxide semiconductor layer includes at least two metal oxides, where the two metal oxides have a varying concentration relative to one another between a lower surface and an upper surface of the oxide semiconductor layer.

Another innovative aspect of the subject matter described in this disclosure can be implemented in an apparatus. The apparatus includes a substrate and a thin film transistor (TFT) over the substrate. The TFT includes an oxide semiconductor layer over the substrate, where the oxide semiconductor layer has a source region, a drain region, and a channel region such that the channel region is between the source region and the drain region, a dielectric layer over the channel region of the oxide semiconductor layer, a gate metal over the dielectric layer, a source metal adjacent to the source region of the oxide semiconductor layer, and a drain metal adjacent to the drain region of the oxide semiconductor layer. The oxide semiconductor layer includes at least two metal oxides, where the two metal oxides have a varying concentration relative to one another between a lower surface and an upper surface of the oxide semiconductor layer.

Details of one or more implementations of the subject matter described in this disclosure are set forth in the accompanying drawings and the description below. Although the examples provided in this disclosure are primarily described in terms of EMS and MEMS-based displays the concepts provided herein may apply to other types of displays such as liquid crystal displays, organic light-emitting diode ("OLED") displays, and field emission displays. Other features, aspects, and advantages will become apparent from the description, the drawings and the claims. Note that the relative dimensions of the following figures may not be drawn to scale.

BRIEF DESCRIPTION OF THE DRAWINGS

FIG. 4A shows an example of a cross-sectional schematic view of a substrate with a hydrophobic resist.

FIG. 4B shows an example of a cross-sectional schematic view of the substrate in FIG. 4A with an exposed portion of the substrate treated by hydroxylation.

FIG. 4C shows an example of a cross-sectional schematic view of the substrate in FIG. 4B with a metal oxide layer selectively deposited on the exposed portion of the substrate.

FIG. 4D shows an example of a cross-sectional schematic view of the substrate in FIG. 4C with the hydrophobic resist removed.

Like reference numbers and designations in the various drawings indicate like elements.

DETAILED DESCRIPTION

Figure 1:
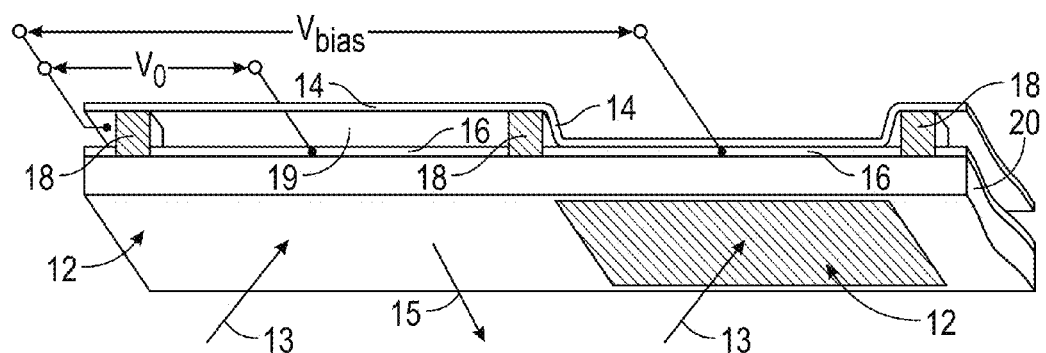
FIG. 1 is an isometric view illustration depicting two adjacent interferometric modulator (IMOD) display elements in a series or array of display elements of an IMOD display device.

The following description is directed to certain implementations for the purposes of describing the innovative aspects of this disclosure. However, a person having ordinary skill in the art will readily recognize that the teachings herein can be applied in a multitude of different ways. The described implementations may be implemented in any device, apparatus, or system that can be configured to display an image, whether in motion (such as video) or stationary (such as still images), and whether textual, graphical or pictorial. More particularly, it is contemplated that the described implementations may be included in or associated with a variety of electronic devices such as, but not limited to: mobile telephones, multimedia Internet enabled cellular telephones, mobile television receivers, wireless devices, smartphones, Bluetooth® devices, personal data assistants (PDAs), wireless electronic mail receivers, hand-held or portable computers, netbooks, notebooks, smartbooks, tablets, printers, copiers, scanners, facsimile devices, global positioning system (GPS) receivers/ navigators, cameras, digital media players (such as MP3 players), camcorders, game consoles, wrist watches, clocks, calculators, television monitors, flat panel displays, electronic reading devices (e.g., e-readers), computer monitors, auto displays (including odometer and speedometer displays, etc.), cockpit controls and/or displays, camera view displays (such as the display of a rear view camera in a vehicle), electronic photographs, electronic billboards or signs, projectors, architectural structures, microwaves, refrigerators, stereo systems, cassette recorders or players, DVD players, CD players, VCRs, radios, portable memory chips, washers, dryers, washer/dryers, parking meters, packaging (such as in electromechanical systems (EMS) applications including microelectromechanical systems (MEMS) applications, as well as non-EMS applications), aesthetic structures (such as display of images on a piece of jewelry or clothing) and a variety of EMS devices. The teachings herein also can be used in non-display applications such as, but not limited to, electronic switching devices, radio frequency filters, sensors, accelerometers, gyroscopes, motion-sensing devices, magnetometers, inertial components for consumer electronics, parts of consumer electronics products, varactors, liquid crystal devices, electrophoretic devices, drive schemes, manufacturing processes and electronic test equipment. Thus, the teachings are not intended to be limited to the implementations depicted solely in the Figures, but instead have wide applicability as will be readily apparent to one having ordinary skill in the art.

Some implementations described herein relate to a thin film transistor (TFT) device fabricated on a substrate. The TFT device can include a gate electrode, an oxide semiconductor layer, and a gate insulator between the gate electrode and the oxide semiconductor layer. The oxide semiconductor layer includes at least two metal oxides, with the two metal oxides having a varying concentration relative to one another between a lower surface and an upper surface of the oxide semiconductor layer. Thus, the oxide semiconductor layer can have a graded composition between the at least two metal oxides. The TFT device also includes a source metal adjacent to a portion of the oxide semiconductor layer and a drain metal adjacent to another portion of the oxide semiconductor layer. The TFT device can have a top gate geometry or a bottom gate geometry.

In some implementations, the oxide semiconductor layer is amorphous. The substrate on which the TFT device is fabricated upon can be pre-patterned with a hydrophobic resist. One surface of the oxide semiconductor layer can include a substantially insulating metal oxide, and the opposite surface of the oxide semiconductor layer can include a substantially semiconducting metal oxide. The oxide semiconducting layer can include indium-gallium-zinc-oxide (IGZO). The thickness of the oxide semiconducting layer can be less than about 100 Å.

Particular implementations of the subject matter described in this disclosure can be implemented to realize one or more of the following potential advantages. Implementations of the methods and apparatuses described herein may be used to reduce costs of fabricating metal oxide layers. Deposition of metal oxides, such as multi-component oxides, over a pre-patterned substrate reduces substantial waste of precious materials by avoiding conventional masking and lithography steps. The method enables formation of a self-aligned metal oxide island that can be a part of a semiconductor layer of a TFT. This can also reduce costs as well as the complexity and number of processing steps.

Furthermore, implementations of the methods and apparatuses described herein may be used to improve the performance and stability of metal oxide TFTs. Formation of a graded metal oxide semiconducting layer for a TFT device can afford precise control over the constituency of what has been deposited and the stoichiometry. Such precise control can produce a high mobility region near the interface between the semiconductor layer and the gate insulator, and a low mobility but highly stable region near the back channel surface. Such a design can improve the electrical properties of the semiconducting layer near or at its interface with the gate dielectric layer while providing a stable, insulating barrier at the back channel surface.

An example of a suitable EMS or MEMS device or apparatus, to which the described implementations of the TFT may apply, is a reflective display device. Reflective display devices can incorporate interferometric modulator (IMOD) display elements that can be implemented to selectively absorb and/or reflect light incident thereon using principles of interferometric absorption. IMOD display elements can include a partial optical absorber, a reflector that is movable with respect to the absorber, and an optical resonant cavity defined between the absorber and the reflector. In some implementations, the reflector can be moved to two or more different positions, which can change the size of the optical resonant cavity and thereby affect the reflectance and absorption of the IMOD. The reflectance spectra of IMOD display elements can create fairly broad spectral bands that can be shifted across the visible wavelengths to generate different colors. The position of the spectral band can be adjusted by changing the thickness of the optical resonant cavity. One way of changing the optical resonant cavity is by changing the position of the reflector with respect to the absorber.

FIG. 1 is an isometric view illustration depicting two adjacent interferometric modulator (IMOD) display elements in a series or array of display elements of an IMOD display device. The IMOD display device includes one or more interferometric EMS, such as MEMS, display elements. In these devices, the interferometric MEMS display elements can be configured in either a bright or dark state. In the bright ("relaxed," "open" or "on," etc.) state, the display element reflects a large portion of incident visible light. Conversely, in the dark ("actuated," "closed" or "off," etc.) state, the display element reflects little incident visible light. MEMS display elements can be configured to reflect predominantly at particular wavelengths of light allowing for a color display in addition to black and white. In some implementations, by using multiple display elements, different intensities of color primaries and shades of gray can be achieved.

The IMOD display device can include an array of IMOD display elements which may be arranged in rows and columns. Each display element in the array can include at least a pair of reflective and absorptive layers, such as a movable reflective layer (i.e., a movable layer, also referred to as a mechanical layer) and a fixed absorptive layer (i.e., a stationary layer), positioned at a variable and controllable distance from each other to form an air gap (also referred to as an optical gap, cavity or optical resonant cavity). The movable reflective layer may be moved between at least two positions. For example, in a first position, i.e., a relaxed position, the movable reflective layer can be positioned at a distance from the fixed absorptive layer. In a second position, i.e., an actuated position, the movable reflective layer can be positioned more closely to the absorptive layer. Light can be absorbed within the absorptive layer depending on the position of the movable reflective layer relative to the absorptive layer, thereby producing either a reflective or non-reflective state for each display element. In some implementations, the display element may be in a reflective state when unactuated and may be in a dark state when actuated. In some other implementations, however, an IMOD display element may be in a dark state when unactuated, and in a reflective state when actuated. In some implementations, the introduction of an applied voltage can drive the display elements to change states. In some other implementations, an applied charge can drive the display elements to change states.

The depicted portion of the array in FIG. 1 includes two adjacent interferometric MEMS display elements in the form of IMOD display elements 12. In the display element 12 on the right (as illustrated), the movable reflective layer 14 is illustrated in an actuated position near, adjacent or touching the optical stack 16. The voltage $V_{bias}$ applied across the display element 12 on the right is sufficient to move and also maintain the movable reflective layer 14 in the actuated position. In the display element 12 on the left (as illustrated), a movable reflective layer 14 is illustrated in a relaxed position at a distance (which may be predetermined based on design parameters) from an optical stack 16, which includes a absorptive layer. The voltage $V_0$ applied across the display element 12 on the left is insufficient to cause actuation of the movable reflective layer 14 to an actuated position such as that of the display element 12 on the right.

In FIG. 1, the reflective properties of IMOD display elements 12 are generally illustrated with arrows indicating light 13 incident upon the IMOD display elements 12, and light 15 reflecting from the display element 12 on the left. Most of the light 13 incident upon the display elements 12 may be transmitted through the transparent substrate 20, toward the optical stack 16. A portion of the light incident upon the optical stack 16 may be transmitted through the absorptive layer of the optical stack 16, and a portion will be reflected back through the transparent substrate 20. The portion of light 13 that is transmitted through the optical stack 16 may be reflected from the movable reflective layer 14, back toward (and through) the transparent substrate 20. As described above, some of this light can be absorbed by the absorptive layer depending on the position of the movable reflective layer relative to the absorptive layer, thereby producing either a reflective or non-reflective state for each display element. In some implementations, the transparent substrate 20 can be a glass substrate (sometimes referred to as a glass plate or panel). The glass substrate may be or include, for example, a borosilicate glass, a soda lime glass, quartz, Pyrex, or other suitable glass material. In some implementations, the glass substrate may have a thickness of 0.3, 0.5 or 0.7 millimeters, although in some implementations the glass substrate can be thicker (such as tens of millimeters) or thinner (such as less than 0.3 millimeters). In some implementations, a non-glass substrate can be used, such as a polycarbonate, acrylic, polyethylene terephthalate (PET) or polyether ether ketone (PEEK) substrate. In such an implementation, the non-glass substrate will likely have a thickness of less than 0.7 millimeters, although the substrate may be thicker depending on the design considerations. In some implementations, a non-transparent substrate, such as a metal foil or stainless steel-based substrate can be used. For example, a reverse-IMOD-based display, which includes a fixed reflective layer and a movable layer which is partially transmissive and absorptive, may be configured to be viewed from the opposite side of a substrate as the display elements 12 of FIG. 1 and may be supported by a non-transparent substrate.

The optical stack 16 can include a single layer or several layers. The layer(s) can include one or more of an electrode layer, a absorptive and partially transmissive layer, and a transparent dielectric layer. In some implementations, the optical stack 16 is electrically conductive, partially transparent and absorptive, and may be fabricated, for example, by depositing one or more of the above layers onto a transparent substrate 20. The electrode layer can be formed from a variety of materials, such as various metals, for example indium tin oxide (ITO). The absorptive layer can be formed from a variety of materials that are absorptive, such as various metals (e.g., chromium and/or molybdenum), semiconductors, and dielectrics. The absorptive layer can be formed of one or more layers of materials, and each of the layers can be formed of a single material or a combination of materials. In some implementations, certain portions of the optical stack 16 can include a single semi-transparent thickness of metal or semiconductor which serves as both a partial optical absorber and electrical conductor, while different, electrically more conductive layers or portions (e.g., of the optical stack 16 or of other structures of the display element) can serve to bus signals between IMOD display elements. The optical stack 16 also can include one or more insulating or dielectric layers covering one or more conductive layers or an electrically conductive/partially absorptive layer.

In some implementations, at least some of the layer(s) of the optical stack 16 can be patterned into parallel strips, and may form row electrodes in a display device as described further below. As will be understood by one having ordinary skill in the art, the term "patterned" is used herein to refer to masking as well as etching processes. In some implementations, a highly conductive and reflective material, such as aluminum (Al), may be used for the movable reflective layer 14, and these strips may form column electrodes in a display device. The movable reflective layer 14 may be formed as a series of parallel strips of a deposited metal layer or layers (orthogonal to the row electrodes of the optical stack 16) to form columns deposited on top of supports, such as the illustrated posts 18, and an intervening sacrificial material located between the posts 18. When the sacrificial material is etched away, a defined gap 19, or optical cavity, can be formed between the movable reflective layer 14 and the optical stack 16. In some implementations, the spacing between posts 18 may be approximately 1-1000 μm, while the gap 19 may be approximately less than 10,000 Angstroms (Å).

In some implementations, each IMOD display element, whether in the actuated or relaxed state, can be considered as a capacitor formed by the fixed and moving reflective layers.

When no voltage is applied, the movable reflective layer 14 remains in a mechanically relaxed state, as illustrated by the display element 12 on the left in FIG. 1, with the gap 19 between the movable reflective layer 14 and optical stack 16. However, when a potential difference, i.e., a voltage, is applied to at least one of a selected row and column, the capacitor formed at the intersection of the row and column electrodes at the corresponding display element becomes charged, and electrostatic forces pull the electrodes together. If the applied voltage exceeds a threshold, the movable reflective layer 14 can deform and move near or against the optical stack 16. A dielectric layer (not shown) within the optical stack 16 may prevent shorting and control the separation distance between the layers 14 and 16, as illustrated by the actuated display element 12 on the right in FIG. 1. The behavior can be the same regardless of the polarity of the applied potential difference. Though a series of display elements in an array may be referred to in some instances as "rows" or "columns," a person having ordinary skill in the art will readily understand that referring to one direction as a "row" and another as a "column" is arbitrary. Restated, in some orientations, the rows can be considered columns, and the columns considered to be rows. In some implementations, the rows may be referred to as "common" lines and the columns may be referred to as "segment" lines, or vice versa. Furthermore, the display elements may be evenly arranged in orthogonal rows and columns (an "array"), or arranged in non-linear configurations, for example, having certain positional offsets with respect to one another (a "mosaic"). The terms "array" and "mosaic" may refer to either configuration. Thus, although the display is referred to as including an "array" or "mosaic," the elements themselves need not be arranged orthogonally to one another, or disposed in an even distribution, in any instance, but may include arrangements having asymmetric shapes and unevenly distributed elements.

Figure 2:
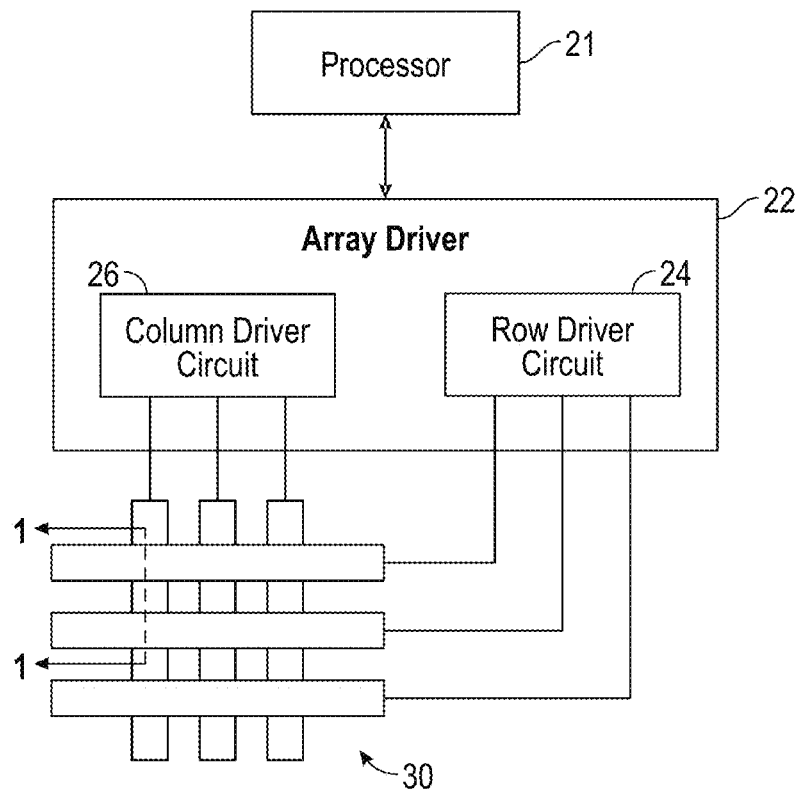
FIG. 2 is a system block diagram illustrating an electronic device incorporating an IMOD-based display including a three element by three element array of IMOD display elements.

FIG. 2 is a system block diagram illustrating an electronic device incorporating an IMOD-based display including a three element by three element array of IMOD display elements. The electronic device includes a processor 21 that may be configured to execute one or more software modules. In addition to executing an operating system, the processor 21 may be configured to execute one or more software applications, including a web browser, a telephone application, an email program, or any other software application.

The processor 21 can be configured to communicate with an array driver 22. The array driver 22 can include a row driver circuit 24 and a column driver circuit 26 that provide signals to, for example a display array or panel 30. The cross section of the IMOD display device illustrated in FIG. 1 is shown by the lines 1-1 in FIG. 2. Although FIG. 2 illustrates a 3×3 array of IMOD display elements for the sake of clarity, the display array 30 may contain a very large number of IMOD display elements, and may have a different number of IMOD display elements in rows than in columns, and vice versa.

Figure 3A:
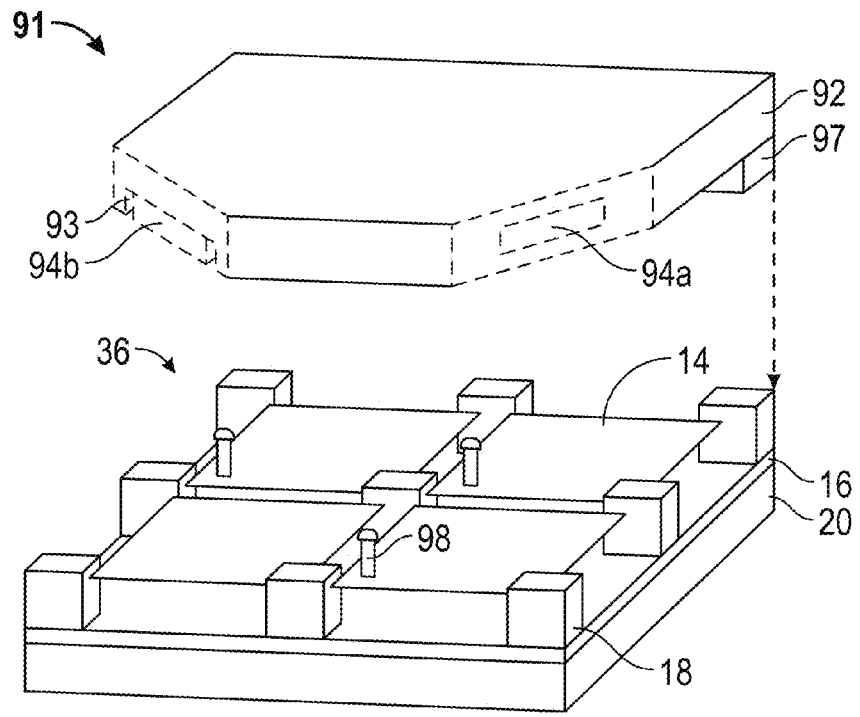
FIGS. 3A and 3B are schematic exploded partial perspective views of a portion of an electromechanical systems (EMS) package including an array of EMS elements and a backplate.
Figure 3B:
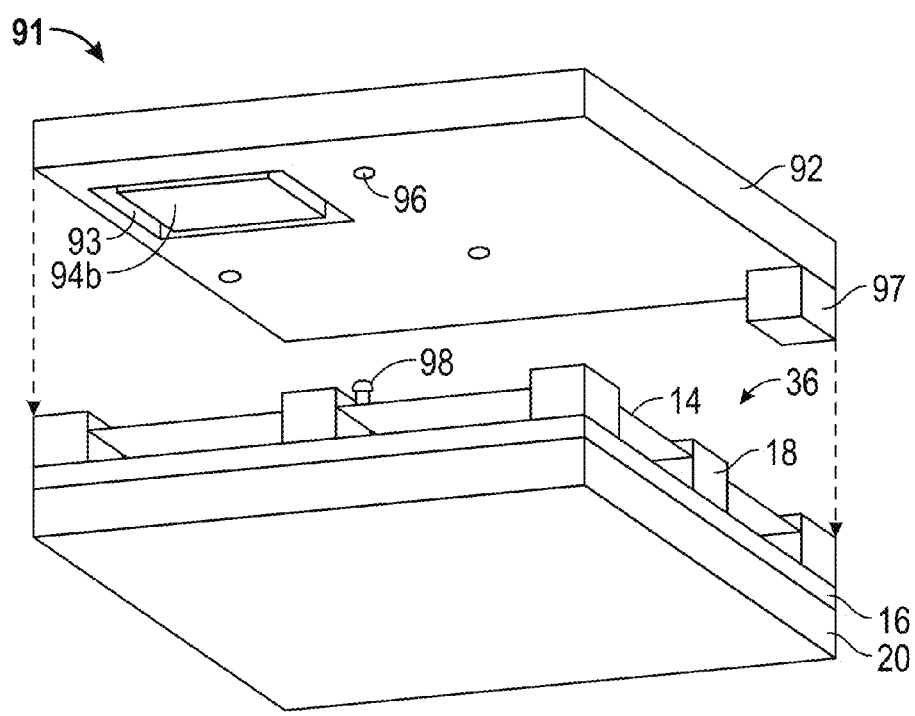

FIGS. 3A and 3B are schematic exploded partial perspective views of a portion of an EMS package 91 including an array 36 of EMS elements and a backplate 92. FIG. 6A is shown with two corners of the backplate 92 cut away to better illustrate certain portions of the backplate 92, while FIG. 6B is shown without the corners cut away. The EMS array 36 can include a substrate 20, support posts 18, and a movable layer 14. In some implementations, the EMS array 36 can include an array of IMOD display elements with one or more optical stack portions 16 on a transparent substrate, and the movable layer 14 can be implemented as a movable reflective layer.

The backplate 92 can be essentially planar or can have at least one contoured surface (e.g., the backplate 92 can be formed with recesses and/or protrusions). The backplate 92 may be made of any suitable material, whether transparent or opaque, conductive or insulating. Suitable materials for the backplate 92 include, but are not limited to, glass, plastic, ceramics, polymers, laminates, metals, metal foils, Kovar and plated Kovar.

As shown in FIGS. 3A and 3B, the backplate 92 can include one or more backplate components 94a and 94b, which can be partially or wholly embedded in the backplate 92. As can be seen in FIG. 3A, backplate component 94a is embedded in the backplate 92. As can be seen in FIGS. 3A and 3B, backplate component 94b is disposed within a recess 93 formed in a surface of the backplate 92. In some implementations, the backplate components 94a and/or 94b can protrude from a surface of the backplate 92. Although backplate component 94b is disposed on the side of the backplate 92 facing the substrate 20, in other implementations, the backplate components can be disposed on the opposite side of the backplate 92.

The backplate components 94a and/or 94b can include one or more active or passive electrical components, such as transistors, capacitors, inductors, resistors, diodes, switches, and/or integrated circuits (ICs) such as a packaged, standard or discrete IC. Other examples of backplate components that can be used in various implementations include antennas, batteries, and sensors such as electrical, touch, optical, or chemical sensors, or thin-film deposited devices.

In some implementations, the backplate components 94a and/or 94b can be in electrical communication with portions of the EMS array 36. Conductive structures such as traces, bumps, posts, or vias may be formed on one or both of the backplate 92 or the substrate 20 and may contact one another or other conductive components to form electrical connections between the EMS array 36 and the backplate components 94a and/or 94b. For example, FIG. 3B includes one or more conductive vias 96 on the backplate 92 which can be aligned with electrical contacts 98 extending upward from the movable layers 14 within the EMS array 36. In some implementations, the backplate 92 also can include one or more insulating layers that electrically insulate the backplate components 94a and/or 94b from other components of the EMS array 36. In some implementations in which the backplate 92 is formed from vapor-permeable materials, an interior surface of backplate 92 can be coated with a vapor barrier (not shown).

The backplate components 94a and 94b can include one or more desiccants which act to absorb any moisture that may enter the EMS package 91. In some implementations, a desiccant (or other moisture absorbing materials, such as a getter) may be provided separately from any other backplate components, for example as a sheet that is mounted to the backplate 92 (or in a recess formed therein) with adhesive. Alternatively, the desiccant may be integrated into the backplate 92. In some other implementations, the desiccant may be applied directly or indirectly over other backplate components, for example by spray-coating, screen printing, or any other suitable method.

In some implementations, the EMS array 36 and/or the backplate 92 can include mechanical standoffs 97 to maintain a distance between the backplate components and the display elements and thereby prevent mechanical interference between those components. In the implementation illustrated in FIGS. 3A and 3B, the mechanical standoffs 97 are formed as posts protruding from the backplate 92 in alignment with the support posts 18 of the EMS array 36. Alternatively or in addition, mechanical standoffs, such as rails or posts, can be provided along the edges of the EMS package 91.

Although not illustrated in FIGS. 3A and 3B, a seal can be provided which partially or completely encircles the EMS array 36. Together with the backplate 92 and the substrate 20, the seal can form a protective cavity enclosing the EMS array 36. The seal may be a semi-hermetic seal, such as a conventional epoxy-based adhesive. In some other implementations, the seal may be a hermetic seal, such as a thin film metal weld or a glass frit. In some other implementations, the seal may include polyisobutylene (PIB), polyurethane, liquid spin-on glass, solder, polymers, plastics, or other materials. In some implementations, a reinforced sealant can be used to form mechanical standoffs.

In alternate implementations, a seal ring may include an extension of either one or both of the backplate 92 or the substrate 20. For example, the seal ring may include a mechanical extension (not shown) of the backplate 92. In some implementations, the seal ring may include a separate member, such as an O-ring or other annular member.

In some implementations, the EMS array 36 and the backplate 92 are separately formed before being attached or coupled together. For example, the edge of the substrate 20 can be attached and sealed to the edge of the backplate 92 as discussed above. Alternatively, the EMS array 36 and the backplate 92 can be formed and joined together as the EMS package 91. In some other implementations, the EMS package 91 can be fabricated in any other suitable manner, such as by forming components of the backplate 92 over the EMS array 36 by deposition.

A thin film transistor (TFT) is a type of field-effect transistor made by depositing thin films of a semiconductor material over a substrate, and can be used as a switching device. With increasing developments in flat panel displays, systems-on-glass, display devices, mobile devices, and the like, there is growing demand for high-performance TFTs.

Metal oxide semiconductor layers can include multi-component oxide materials. One common multi-component oxide is IGZO. Multi-component oxides can combine two or more metal oxides to realize a wide bandgap system. In addition, multi-component oxides have high mobility in the amorphous state and can be fabricated in low processing temperature conditions.

Fabricating oxide semiconductor layers, including amorphous oxide semiconductors, can pose several challenges. For example, many metal oxide materials, such as multi-component oxide materials, include materials that are relatively expensive. Blanket deposition of such materials followed by etching can result in a substantial waste of precious material.

In addition, deposition of oxide materials, such as multi-component oxide materials, is typically done via physical vapor deposition (PVD) and pulsed laser deposition (PLD). Deposition by PVD or PLD generally lacks precise control over the constituency of what has been deposited and the stoichiometry. Electric characteristics and stability of a transistor can be readily affected by the state of the interface between an oxide semiconductor layer and an insulating layer. Without precise control of the relative concentrations of various oxide materials in the oxide semiconductor layer, the electric characteristics and stability of the transistor can degrade.

FIG. 4A shows an example of a cross-sectional schematic view of a substrate with a hydrophobic resist. Prior to deposition, a hydrophobic resist 410 can be used to cover portions of a substrate 400. The hydrophobic resist 410 can be any type of resist, including a photoresist or electron beam (e-beam)

resist. Examples of hydrophobic photoresists include polymethyl-methacrylate (PMMA), SU-8, and fluorinated polymers. The hydrophobic resist 410 can be masked, patterned by exposure, developed, and etched to form an opening 405 that leaves at least a portion of the substrate 400 exposed.

The substrate 400 may be made of any number of different substrate materials, including transparent and non-transparent materials. In some implementations, the substrate 400 on which the hydrophobic resist 410 is formed upon can be hydrophilic. For example, the substrate 400 can be any amorphous or other non-crystalline substrate, including but not limited to glass, spin-on glass, plastic, polymers, and thermal oxide substrates. Glass substrates (sometimes referred to as glass plates or panels) may be or include a borosilicate glass, a soda lime glass, photoglass, quartz, Pyrex, or other suitable glass material. A non-glass substrate can be used, such as a polycarbonate, acrylic, polyethylene terephthalate (PET), or polyether ether ketone (PEEK) substrate. In some implementations, the substrate 400 may include a crystalline bulk material with a coating of non-crystalline material on which the resist 410 can be formed.

In some implementations, the substrate 400 can have a thickness between about 10 microns and about 1100 microns. The thickness of the substrate 400 can vary according to implementation. For example, where the substrate 400 is a glass substrate for a MEMS device that is to be further packaged, the thickness can be between about 10 microns and about 300 microns, such as between about 50 microns and about 300 microns. In some implementations, where the substrate 400 is a glass substrate with surface mount device (SMD) pads and is configured to mount onto a printed circuit board (PCB), the thickness may be at least about 300 microns, such as between about 300 microns and about 500 microns. In some implementations, the substrate 400 can be a glass substrate that can include one or more panels, and can have a thickness of at least 700 microns, such as between about 700 microns and about 1100 microns.

In some implementations, the substrate 400 can include a source region, a channel region, and a drain region. These are regions over which the source, channel, and drain of the TFT device can eventually be formed. The channel region is the region of the substrate 400 over which the gate of the TFT can eventually be formed, with the source region and the drain region being the regions over which the source and drain can eventually be formed. The channel region is between the source region and the drain region, and in some implementations connects these regions. It should be noted that in some implementations, these regions are defined at least in part by formation of a gate electrode of the TFT device, with the region of the substrate 400 underlying and aligned with the gate electrode defined as the channel region of the substrate 400.

The hydrophobic resist 410 can be made of highly hydrophobic and radiation-definable material. The hydrophobic resist 410 may be blanket deposited on the substrate 400 using any suitable deposition techniques, including but not limited to physical vapor deposition (PVD, including sputtering and evaporation), plasma-enhanced chemical vapor deposition (PECVD), thermal chemical vapor deposition (thermal CVD), atomic layer deposition (ALD), or spin-coating.

To expose a portion of the substrate 400, the hydrophobic resist 410 may be patterned. Patterning the hydrophobic resist 410 can include exposing a select portion of the hydrophobic resist to a radiation source, such as light, through a photomask. Other radiation sources may include an ultra-violet (UV) light or an e-beam source. The select portion of the hydrophobic resist 410 may be subsequently developed and etched to form an opening 405, thereby creating a pre-patterned surface for the substrate 400. The patterned hydrophobic resist 410 remains highly hydrophobic so as to substantially prevent oxide semiconductor growth or nucleation on the hydrophobic resist 410, while the exposed portion of the substrate 400 may be hydrophilic to promote oxide semiconductor growth or nucleation.

In some implementations, the hydrophobic resist 410 can include a positive resist material. For example, the hydrophobic resist 410 can include at least one of SU-8, PMMA, and fluorinated polymers. In some other implementations, the hydrophobic resist 410 can include a negative resist material. If used, a negative resist material remains hydrophobic after being developed or can be rendered hydrophobic by the development process.

FIG. 4B shows an example of a cross-sectional schematic view of the substrate in FIG. 4A with an exposed portion of the substrate treated by hydroxylation. The substrate 400 can be subject to a chemical treatment that selectively forms a hydrophilic surface 415 on the exposed portion of the substrate 400. Forming a hydrophilic surface includes making the exposed portion of substrate 400 more hydrophilic. In some implementations, the chemical treatment uses an alkali hydroxide such as sodium hydroxide (NaOH) over the exposed portion of the substrate 400. In some implementations, the hydroxylation utilizes flowing water vapor over the exposed portion of the substrate 400 to chemically react with the exposed portion of the substrate 400. The chemical reaction with the exposed portion of the substrate 400 forms the hydrophilic surface 415 thereon, such that the hydrophilic surface 415 terminates in hydroxyl functional groups. The adsorbed hydroxyl functional groups provide the basis for chemisorption to take place. Hydroxylation can activate the surface of the substrate 400, such as by anchoring hydroxyl functional groups onto the surface. For example, hydroxylation can activate glass through the formation of Si—OH units on the surface of the substrate 400. In some other implementations, the exposed portions of the surface of the substrate 400 can be treated by a gas plasma to hydroxylate the surface. In some implementations, the hydrophobic resist 410 may also be exposed to the water vapor, gas plasma, or other chemical treatment, without being hydroxylated. The chemical treatment is selective in that it can hydroxylate the exposed portion of the substrate 400, while leaving the hydrophobic resist 410 substantially unhydroxylated. A substantially unhydroxylated surface can include trace amounts of hydroxyl groups.

FIG. 4C shows an example of a cross-sectional schematic view of the substrate in FIG. 4B with a metal oxide layer selectively deposited on the exposed portion of the substrate. The metal oxide layer 420 is selectively deposited on the hydrophilic surface of the substrate 400 and not on the hydrophobic resist 410. In some implementations, the metal oxide layer 420 is selectively deposited by ALD. In some implementations, the metal oxide layer 420 is selectively deposited by other deposition techniques, such as CVD. Selective deposition on the hydrophilic surface of the substrate 400 can include trace amounts of metal oxide deposited on the hydrophobic resist 410.

The metal oxide layer 420 can include one or more transition or post-transition metals, including for example, aluminum (Al), copper (Cu), zinc (Zn), gallium (Ga), germanium (Ge), arsenic (As), silver (Ag), cadmium (Cd), indium (In), tin (Sn), antimony (Sb), gold (Au), mercury (Hg), titanium (Ti), lead (Pb), bismuth (Bi), and hafnium (Hf). The metal oxide layer 420 can be a single component metal oxide or a multi-component metal oxide, including mixed metal oxides.

In some implementations, the metal oxide layer 420 can be part of a semiconductor layer of a TFT.

The unterminated bonds at the hydrophilic surface 415 of the substrate 400 presents a high energy surface, while the hydrophobic resist 410 presents a low energy surface. The difference in surface energy between the hydrophilic surface 415 of the substrate 400 and hydrophobic resist 410 enables selective growth or nucleation of the metal oxide layer 420 on the hydrophilic surface 415 of the substrate 400. Hence, the hydrophobic resist 410 is substantially unreactive to metal-containing precursors and oxidant precursors flowing over the hydrophobic resist 410. On the other hand, the exposed portion of the substrate 400 treated by hydroxylation is substantially reactive to metal-containing precursors and oxidant precursors flowing over the exposed portion of the substrate 400.

In some implementations, the pre-patterned substrate 400 enables the as-deposited metal oxide layer 420 to be self-aligned. Thus, the pre-patterned substrate 400 provides a templated surface to facilitate self-aligned deposition of the metal oxide layer 420. In some implementations, the substrate 400 can provide a plurality of openings in the hydrophobic resist 410 with exposed surfaces treated by hydroxylation so as to provide regions where islands of metal oxide layers 420 can grow. The metal oxide layers 420 can form metal oxide islands that do not have to undergo separate lithography and/or etch processes.

The metal oxide layer 420 may be selectively deposited by ALD. ALD is a self-limiting vapor phase deposition technique that involves a sequential introduction of pulses of gases that can result in alternating self-limiting adsorption of monolayers of reactants on the surface of a substrate and other exposed surfaces. The ALD technique is well-suited for precise tailoring of very thin films with film growth as fine as about 0.1 nm per cycle. To grow films by the ALD technique, a substrate can be placed in a reaction chamber where process conditions, including temperature, pressure, precursor dosage, and purging times are adjusted to meet the requirements of the process chemistry and the substrate materials. In some implementations, the temperature is in the range of about 20° C. to about 600° C., and the pressure in the range of about 1 Pa to about 1000 Pa. Typically, ALD processing temperatures for a glass substrate can be below about 480° C. to avoid high temperature related problems that can adversely impact underlying layers or the substrate.

ALD processes use surface-mediated deposition reactions to deposit films on a layer-by-layer basis. A first precursor can be directed over the substrate, with at least some of the first precursor chemisorbing or physisorbing onto the surface of the substrate to form a monolayer. A purge gas can be introduced to remove non-reacted precursors and gaseous reaction byproducts. In some implementations, the first precursor can decompose to form a film layer. In some other implementations, a second precursor can be introduced which can react with the monolayer of the first precursor. Thermal energy can be provided to the substrate to activate surface reactions between the first precursor and the second precursor to form a film layer. Other energetic means, such as a plasma, may be combined with the thermal energy to drive the reaction between the first precursor and the second precursor. A purge gas may be subsequently introduced to remove excess precursors and gaseous reaction byproducts. This completes one cycle. The precursors can be alternately pulsed into the reaction chamber with little to no overlap. The cycles may be repeated as many times as desired to form a film of a suitable thickness.

The desired thickness of the ALD-deposited metal oxide layers can be controlled by the number of reaction cycles. One cycle may take time from about 0.5 seconds to a few tens of seconds and deposit between about 0.1 nm and about 0.4 nm thickness of material. Thus, each of the ALD-deposited metal oxide layers in the range of about 3 nm and about 50 nm in thickness can be precisely tailored within 0.1 nm accuracy.

Moreover, in some implementations, pulses of a single precursor that can decompose to form the desired ALD-deposited layer may be alternatingly introduced with purge gas pulses. In some implementations, precursors may be alternatingly pulsed into a reaction chamber without intervening pulses of purge gases.

It will be understood that any of the ALD-deposited metal oxide layers (or other ALD-deposited layers) can be made using different combinations of precursors. In some implementations, to deposit by ALD a layer of zinc oxide (ZnO), a zinc-containing precursor may include diethyl zinc ($(C_2H_5)_2Zn$) or dimethyl zinc ($(CH_3)_2Zn$), and an oxygen-containing precursor may include water ($H_2O$), ozone ($O_3$), and oxygen ($O_2$). For example, a first precursor of diethyl zinc may react with a second precursor of water to form an ALD-deposited ZnO film. It is understood that the ALD-deposited layers of zinc oxide can have different stoichiometries than provided in this example and hereinafter.

In some implementations, to deposit by ALD a layer of indium oxide ($In_2O_3$), an indium-containing precursor may include an indium chloride, cyclopentadienyl indium, and trimethyl indium, and an oxygen-containing precursor may include $O_2$, $O_3$, $H_2O$, and hydrogen peroxide ($H_2O_2$). For example, a first precursor of trimethyl indium may react with a second precursor of water to form an ALD-deposited $In_2O_3$ film. In another example, a first precursor of cyclopentadienyl indium (CpIn) may react with a second precursor of ozone to form an ALD-deposited $In_2O_3$ film. It is understood that the ALD-deposited layers of indium oxide can have different stoichiometries than provided in this example and hereinafter.

In some implementations, to deposit by ALD a layer of gallium oxide ($Ga_2O_3$), a gallium-containing precursor may include cyclo(trimmido-hexamethyltrigallium) ($[(CH_3)_2GaNH_2]_3$), trimethyl gallium ($(CH_3)_3Ga$), dimethyl gallium isopropoxide (DMGIP), and gallium chloride ($GaCl_3$), and an oxygen-containing precursor may include $O_2$ plasma, $O_2$, and water. For example, a first precursor of trimethyl gallium may react with a second precursor of water to form an ALD-deposited $Ga_2O_3$ film. In another example, a first precursor of $[(CH_3)_2GaNH_2]_3$ may react with a second precursor of $O_2$ plasma to form an ALD-deposited $Ga_2O_3$ film. It is understood that the ALD-deposited layers of gallium oxide can have different stoichiometries than provided in this example and hereinafter.

FIG. 4D shows an example of a cross-sectional schematic view of the substrate in FIG. 4C with the hydrophobic resist removed. After the metal oxide layer 420 has been deposited by ALD and self-aligned with the opening 405 of the hydrophobic resist 410, the hydrophobic resist 410 may be removed.

In some implementations, the hydrophobic resist 410 is removed by a lift-off process. The hydrophobic resist 410 is exposed to a removal solvent to loosen the hydrophobic resist 410 from the substrate 400. The hydrophobic resist 410 is lifted off or removed.

In some implementations, the hydrophobic resist 410 may be removed using methods such as ashing or etching. In some implementations, the metal oxide layer 420 may be planarized using techniques such as chemical mechanical polishing (CMP) or "etch back" prior to removal of the hydrophobic resist 410.

Figure 5:
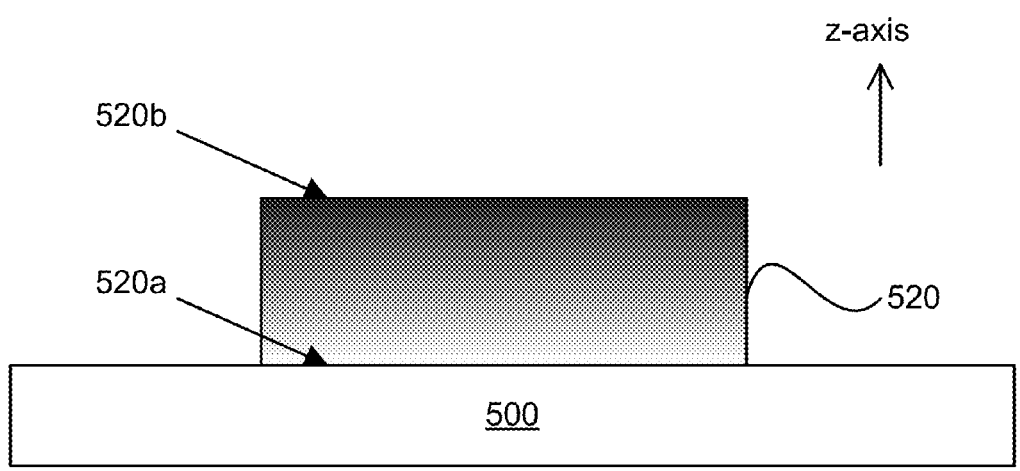
FIG. 5 shows a cross-sectional schematic view of a multicomponent metal oxide semiconductor thin film.

FIG. 5 shows a cross-sectional schematic view of a multi-component metal oxide semiconductor thin film. The multi-component metal oxide semiconductor thin film 520 may be formed on a substrate 500 and may have a lower surface 520a and an upper surface 520b. The multi-component metal oxide thin film 520 may include at least two metal oxides. In some implementations, the multi-component metal oxide thin film 520 may form a graded structure with the composition of one of the metal oxides graded from the lower surface 520a to the upper surface 520b. In some implementations, the multi-component metal oxide thin film 520 can be formed on a substrate using the hydrophobic resist and selective deposition process described earlier herein with respect to FIGS. 4A-4D. In implementations where the multi-component metal oxide thin film 520 is part of a TFT device, the substrate 500 can be a substrate supporting the semiconductor layer of a top gate TFT device, or the substrate 500 can be one or more dielectric layers supporting the semiconductor layer of a bottom gate TFT device. It is understood that the multi-component metal oxide thin film 520 may be formed on a substrate using other techniques, such as conventional photolithography techniques.

Deposition of the multi-component metal oxide thin film 520 can be achieved sequentially by ALD. To form the multi-component metal oxide sequentially, a first metal precursor can be pulsed over the substrate 500, and an oxidant precursor can be pulsed over the first metal precursor to form a first metal oxide layer (A). In some implementations, the metal precursor can adsorb onto the hydroxyl functional groups to anchor the metal, and the oxidation step can react with the adsorption seed to form the metal oxide. Purge gas can remove the unreacted metal precursor and excess byproducts. In some implementations, in a subsequent sequence, a second metal precursor different from the first metal precursor can be pulsed over the first metal oxide layer (A), and an oxidant precursor can be pulsed over the second metal precursor to form a second metal oxide layer (B). In some other implementations, in a subsequent sequence, the first metal precursor can be pulsed again over the first metal oxide layer (A), and an oxidant precursor can be pulsed over the first metal precursor to form another first metal oxide layer (A). This can be followed by deposition of another first metal oxide layer (A) or a second metal oxide layer (B) for a multi-layer arrangement. Hence, sequential deposition of various metal oxide layers can vary the sequence of individual binary oxides and tune the composition of the multi-component metal oxide thin film 520. For example, the multi-component metal oxide thin film 520 can include several different sequences of first and second metal oxide layers, such as A-B-A, B-A-B, A-A-B, B-B-A, A-B-B, B-A-A, A-A-A, B-B-B, and so forth.

In some implementations, such as for a quaternary metal oxide, a third metal precursor can be pulsed over individual binary oxides of the first metal oxide layer (A) and/or the second metal oxide layer (B), and an oxidant precursor can be pulsed over the first metal oxide layer (A) and/or the second metal oxide layer (B) to form a third metal oxide layer (C). Thus, different sequences of the first, second, and third metal oxide layers can vary the sequence of the individual binary oxides and tune the composition of the multi-component metal oxide thin film 520, including sequences such as A-B-C-A, A-B-C-B, A-B-C-C, A-B-B-A, A-B-B-B, A-B-B-C, A-B-A-C, A-B-A-B, A-B-A-A, A-A-C-C, A-A-C-B, A-A-C-A, A-A-B-C, A-A-B-B, A-A-B-A, A-A-A-C, A-A-A-B, A-A-A-A, and so forth. In some implementations, the sequence of deposition can be digitally programmed.

In some implementations, ALD deposition of the multi-component metal oxide thin film 520, such as a thin film of IGZO, can include a set of methylized metals: trimethyl indium (($CH_3)_3In$), trimethyl gallium (($CH_3)_3Ga$), and dimethyl zinc ($(C_2H_5)_2Zn$). In other words, the first, second, and third metal precursor can include at least one of trimethyl indium, trimethyl gallium, and dimethyl zinc. In general, the first, second, and third metal precursors can be volatile, have a relatively low vaporization temperature, share a common oxidant precursor, have a relatively high stability, and have byproducts from adsorption or oxidation reactions that do not etch deposited material. For example, the first, second, and third metal precursors can share the same oxidant precursor of water. In some implementations, ALD deposition of IGZO can include any of the precursor combinations for ALD-deposited ZnO, $In_2O_3$, and $Ga_2O_3$ as described earlier herein or known in the art. Deposition of each binary oxide can be performed in relatively low processing temperatures, such as about 400° C. or less.

Multi-component metal oxides other than IGZO may be formed by ALD, including but not limited to indium gallium oxide (IGO), indium zinc oxide (IZO), indium tin zinc oxide (ITZO), zinc tin oxide (ZTO), hafnium indium zinc oxide (HIZO), and indium aluminum zinc oxide (IAZO). It will be understood that any of the metals, In, Ga, and Zn, may be interchangeably replaced with one of the transition or post-transition metals discussed earlier herein to form other stable multi-component metal oxides. For example, Ga may be substituted with other metals such as Al, Ge, and Hf, which can form other insulating oxides such as aluminum oxide ($Al_2O_3$), germanium oxide ($GeO_2$), and hafnium oxide ($HfO_2$). It is understood that the examples of metal oxides can have different stoichiometries than the examples provided above and hereinafter.

The crystallinity of the multi-component metal oxide thin film 520 formed by ALD may depend on the crystallinity of the substrate 500. The ALD reactions generally follow the order of the underlying surface. Thus, if the substrate 500 on which ALD is performed is non-crystalline, then the lateral structure formed upon the substrate 500 will likewise be non-crystalline. Thus, deposition by ALD may form an amorphous structure if the underlying substrate 500 is glass, plastic, thermal oxide, or other non-crystalline material.

However, if the multi-component metal oxide thin film 520 includes multiple ALD-deposited metal oxide layers (e.g., varying sequences of A, B, and C), then the multi-component metal oxide thin film 520 may have some long-range structure in the deposition dimension (z-axis). While each of the ALD-deposited metal oxide layers (e.g., A, B, or C) may behave as amorphous structures, the multi-component metal oxide thin film 520 will have one-dimensional ordering along the z-axis. In other words, the multi-component metal oxide thin film 520 may constitute a superlattice of amorphous sheets. Thus, the multi-component metal oxide thin film 520 having an arrangement of varying sequences of first metal oxide layer (A), second metal oxide layer (B), and third metal oxide layer (C), may form an intermediate state between a completely crystalline state and a completely amorphous state.

The amorphous state in the plane transverse to the deposition dimension enables high device uniformity. The crystalline or long-range ordering in the deposition dimension as a result of sequential deposition by ALD provides vertical monolayer composition control. To obtain such composition control, the sequence of deposition cycles can vary as described earlier herein to form a graded layer structure.

Thus, the graded layer structure in the multi-component metal oxide thin film 520 can have a relatively low concentration of a first metal oxide near the lower surface 520a, for example, and a relatively high concentration of the first metal oxide near the upper surface 520b. In certain implementations of forming an IGZO oxide semiconductor layer for a TFT, an initial sequence of ALD near a gate insulator interface of the multi-component metal oxide thin film 520 can substantially exclude $Ga_2O_3$ while subsequent sequences of ALD near a back channel surface of the multi-component metal oxide thin film 520 can substantially include $Ga_2O_3$.

The multi-component metal oxide thin film described earlier herein can be part of an active layer in a TFT device. The active layer can include a source region, a channel region, and a drain region, with the channel region between the source region and the drain region. The active layer can have at least two metal oxides having varying concentrations relative to one another between a lower surface and an upper surface of the active layer. In the TFT device, whether for a bottom gate TFT device or a top gate TFT device, the gate can be aligned with the channel region of the active layer, and a gate insulator can be formed between the active layer and the gate. In addition, a source metal can be formed adjacent to the source region of the active layer and a drain metal can be formed adjacent to the drain region of the active layer. In some implementations, the surface of the active layer facing towards the gate can substantially include a substantially semiconducting material, and the surface of the active layer facing away from the gate can substantially include a substantially insulating material.

Figure 6:
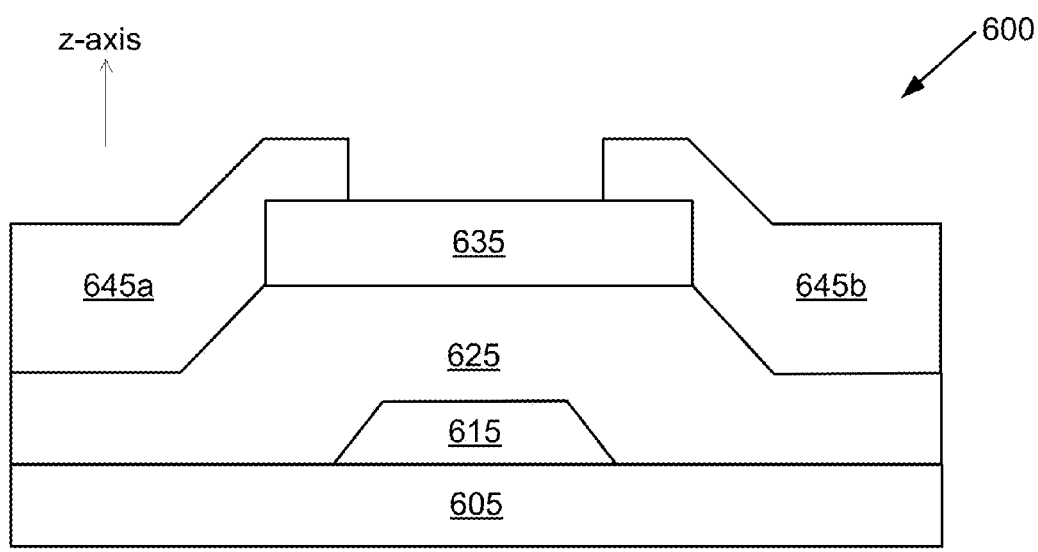
FIG. 6 shows an example of a bottom gate thin film transistor (TFT) device with a metal oxide semiconductor layer.

FIG. 6 shows an example of a bottom gate thin film transistor device with a metal oxide semiconductor layer. The TFT device 600 shown in FIG. 6 is formed over a substrate 605. As illustrated in the example in FIG. 6, the TFT device 600 can be a bottom gate TFT device with a gate directly over the substrate 605.

The TFT device 600 includes a gate electrode 615 over the substrate 605. The gate electrode 615 can include any electrically conductive material, such as Al, Cu, Zn, Ti, tungsten (W), molybdenum (Mo), neodymium (Nd), chromium (Cr), platinum (Pt), tantalum (Ta), and alloys thereof. The gate electrode 615 may also be made of a conductive oxide, such as indium tin oxide (ITO) or indium zinc oxide (IZO). In some implementations, the gate electrode 615 may be formed by stacking two or more electrically conductive materials.

The TFT device 600 also includes a gate insulator 625 over the gate electrode 615 and the substrate 605. The gate insulator 625 may include any insulating material, such as a dielectric material. This can include but is not limited to silicon oxide ($SiO_2$), aluminum oxide ($Al_2O_3$), silicon nitride ($SiN_x$), silicon oxynitride (SiON), titanium oxide ($TiO_2$), ytterbium oxide ($Y_2O_3$), tantalum oxide ($Ta_2O_5$), and $HfO_2$. The gate insulator 625 can include two or more of these compounds. The gate insulator 625 can serve as a substrate supporting pre-patterning with a hydrophobic resist and selective deposition of an oxide semiconductor layer.

The TFT device 600 further includes an oxide semiconductor layer 635 over the gate insulator 625. The oxide semiconductor layer 635 also can be referred to as an active layer, which can be similar to the active layer described with respect to FIG. 5. In some implementations, the oxide semiconductor layer 635 has a thickness of less than about 100 Å. The oxide semiconductor layer 635 may include at least two metal oxides. The oxide semiconductor layer 635 has a lower surface and an upper surface opposite the lower surface, and the lower surface forms an interface with the gate insulator 625. Oxide semiconductor layer 635 can become conducting or insulating depending on the voltage applied to the gate electrode 615.

The oxide semiconductor layer 635 in TFT device 600 can be formed using the hydrophobic resist and selective deposition technique described earlier herein with respect to FIGS. 4A-4D. In such implementations, the hydrophobic resist and selective deposition process can be applied to the gate insulator 625 of the bottom gate TFT device 600. In other words, a dielectric layer in the gate insulator 625 can provide a sufficient starting condition for depositing and patterning a hydrophobic resist, and selectively depositing by ALD onto exposed portions of the gate insulator 625. However, it is understood that the oxide semiconductor layer 635 can be formed using any other suitable technique, such as conventional photolithography techniques.

The oxide semiconductor layer 635 may include at least two metal oxides with varying concentrations relative to one another between the lower surface and the upper surface of the oxide semiconductor layer 635. A first metal oxide can include one or more transition or post-transition metals, including for example, Al, Cu, Zn, Ga, Ge, As, Ag, Cd, In, Sn, Sb, Au, Hg, Ti, Pb, Bi, and Hf, and a second metal oxide can include one or more transition or post-transition metals with a composition different from the first metal oxide.

ALD deposition of the oxide semiconductor layer 635 can provide precise control of the relative concentrations of the at least two metal oxides. With ALD, not only can the composition and stoichiometry of the oxide semiconductor layer 635 be precisely tuned, but the relatively concentrations of the at least two metal oxides can be precisely tuned in the vertical (z-axis) direction. In some implementations, the concentrations of the at least two metal oxides in the oxide semiconductor layer 635 can vary to form a graded structure. For example, the concentration of a first metal oxide can increase or decrease linearly, quadratically, cubically, or by a non-linear function in the vertical direction.

In some implementations, the lower surface of the oxide semiconductor layer 635 can substantially include a first metal oxide and the upper surface of the oxide semiconductor layer 635 can substantially include a second metal oxide. The first metal oxide can be a substantially insulating metal oxide material, such as $Ga_2O_3$, $Al_2O_3$, $HfO_2$, and $GeO_2$. The second metal oxide can be a substantially semiconducting metal oxide material, such as $In_2O_3$ and ZnO.

In some implementations, the oxide semiconductor layer 635 can include IGZO. The concentration of $Ga_2O_3$ may vary from the lower surface to the upper surface of the oxide semiconductor layer 635, and the concentrations of $In_2O_3$ and ZnO may vary from the lower surface to the upper surface of the oxide semiconductor layer 635. Specifically, the concentration of $Ga_2O_3$ can increase from the lower surface to the upper surface of the oxide semiconductor layer 635 such that the concentration of $Ga_2O_3$ is less than about 20% at the lower surface and greater than about 80% at the upper surface of the oxide semiconductor layer 635. As a result, the total concentration of $In_2O_3$ and ZnO can be greater than about 80% at the lower surface and less than about 20% at the upper surface of the oxide semiconductor layer 635. In some implementations, the concentration of $Ga_2O_3$ can be less than about 10%, less than about 5%, or less than about 2% at the lower surface and greater than about 90%, greater than about 95%, or greater than about 98% at the upper surface of the oxide semiconductor layer 635.

The increase in $Ga_2O_3$ or other insulating metal oxide from the lower surface to the upper surface of the oxide semiconductor layer 635 can improve the performance of the TFT device 600. Thus, the oxide semiconductor layer 635 can be more semiconducting at the lower surface, which forms the interface between the oxide semiconductor layer 635 and the gate insulator 625. A region of high electron mobility can form at the interface between the oxide semiconductor layer 635 and the gate insulator 625 so as to increase the electric characteristics (such as the field-effect mobility) of the TFT device 600. In addition, the oxide semiconductor layer 635 can be more insulating at the upper surface, which forms the back channel surface or the interface between the oxide semiconductor layer 635 and a passivation insulator (not shown). A region of low electron mobility can be formed at the back channel surface or the interface between the oxide semiconductor layer 635 and the passivation insulator so as to improve the stability of the TFT device 600. The region of low electron mobility can reduce the formation of defects that can result from subsequent processing or plasma processing of the TFT device 600. For example, the region of low electron mobility may slow the kinetics of oxygen diffusion out of the oxide semiconductor layer 635.

The TFT device 600 further includes a source metal 645a and a drain metal 645b. The source metal 645a may be formed adjacent to a portion of the oxide semiconductor layer 635 and the drain metal 645b may be formed adjacent to another portion of the oxide semiconductor layer 635. The source metal 645a and the drain metal 645b may be formed of any number of different metals, including Al, Cu, Mo Ta, Cr, Nd, Au, Ag, W, Ti, Pt, Ru, and alloys thereof. In some implementations, the source metal 645a and the drain metal 645b include two or more different metals arranged in a stacked structure. In some implementations, the source metal 645a and the drain metal 645b can include a conductive oxide, such as ITO or IZO.

In some implementations, the TFT device 600 may further include a passivation insulator (not shown) over the oxide semiconductor layer 635 and the source metal 645a and the drain metal 645b. The passivation insulator can be formed of any insulating material, such as a dielectric material. The passivation insulator may serve to protect the oxide semiconductor layer 635.

Figure 7:
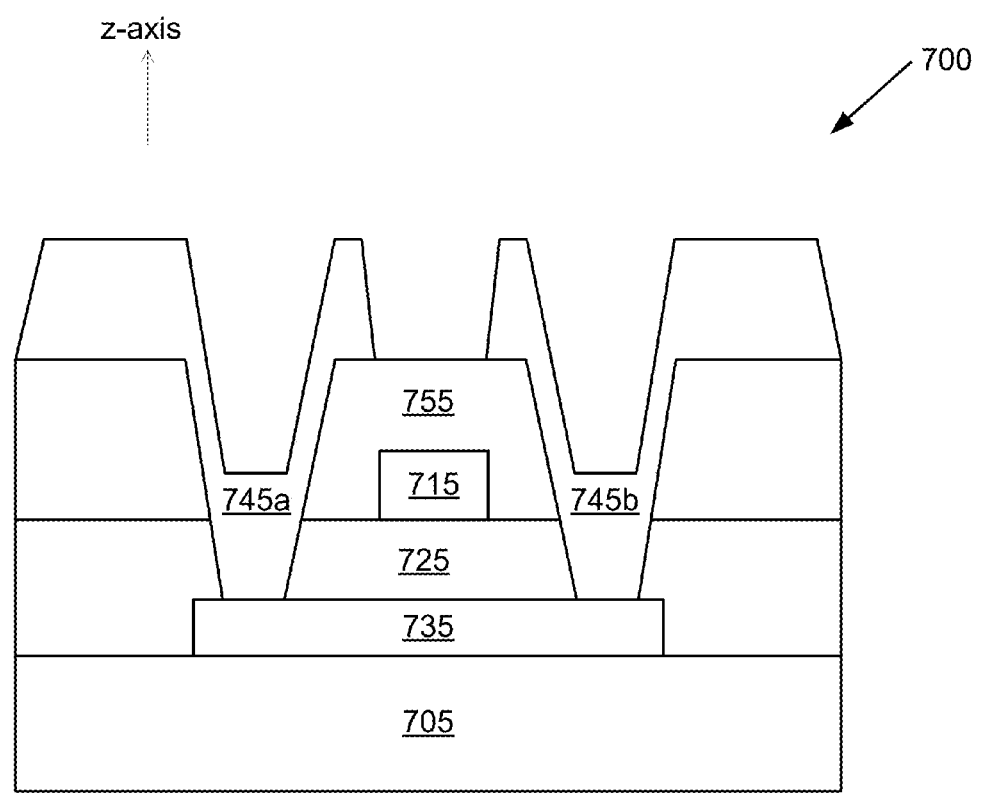
FIG. 7 shows an example of a top gate TFT device with a metal oxide semiconductor layer.

In other implementations, the oxide semiconductor layer as described earlier herein can be part of a top gate TFT. FIG. 7 shows an example of a top gate thin film transistor device with a metal oxide semiconductor layer. The TFT device 700 as shown in FIG. 7 is formed over a substrate 705. As illustrated in the example in FIG. 7, the TFT device 700 can be a top gate TFT device with an oxide semiconductor layer 735 directly over and in contact with the substrate 705. The oxide semiconductor layer 735 also can be referred to as an active layer, which can be similar to the active layer described with respect to FIG. 5. In some implementations, the oxide semiconductor layer 735 has a thickness of less than about 100 Å. The oxide semiconductor layer 735 may include at least two metal oxides.

The TFT device 700 includes an oxide semiconductor layer 735 over the substrate 705, a gate insulator 725 over the oxide semiconductor layer 735, a gate electrode 715 over the gate insulator 725, and a source metal 745a and a drain metal 745b. The source metal 745a may be formed adjacent to a portion of the oxide semiconductor layer 735 and the drain metal 745b may be formed adjacent to another portion of the oxide semiconductor layer 735. In some implementations, the oxide semiconductor layer 735 may include a source region and a drain region, where the source metal 745a is adjacent to over the source region and the drain metal 745b is formed adjacent to the drain region of the oxide semiconductor layer 735.

As illustrated in the example in FIG. 7, the TFT device 700 may further include a passivation insulator 755 over the gate electrode 715. The passivation layer 755 and the gate insulator 725 may each be patterned to selectively expose the portion of the oxide semiconductor layer 735 in contact with the source metal 745a and the portion of the oxide semiconductor layer 735 in contact with the drain metal 745b.

The oxide semiconductor layer 735 in TFT device 700 can be formed using the hydrophobic resist and selective deposition technique described earlier herein with respect to FIGS. 4A-4D. In other words, once a metal oxide layer is selectively deposited on a substrate using a hydrophobic photoresist, and the hydrophobic photoresist is removed, the metal oxide layer over the substrate can be the oxide semiconductor layer 735 over the substrate 705. However, it is understood that the oxide semiconductor layer 735 can be formed using any other suitable technique, such as conventional photolithography techniques.

The oxide semiconductor layer 735 may have a graded structure with at least two metal oxides having varying concentrations relative to one another from a lower surface to an upper surface of the oxide semiconductor layer 735. In some implementations, the concentrations of the metal oxides can be controlled so that the lower surface of the oxide semiconductor layer 735 can be substantially insulating and the upper surface of the oxide semiconductor layer 735 can be substantially semiconducting.

In some implementations, the oxide semiconductor layer 735 can include IGZO. The concentration of $Ga_2O_3$ can decrease from the lower surface of the oxide semiconductor layer 735 to the upper surface of the oxide semiconductor layer 735. For example, the concentration of $Ga_2O_3$ can be greater than about 80%, greater than about 90%, greater than about 95%, or greater than about 92% at the lower surface and less than about 20%, less than about 10%, less than about 5%, or less than about 2% at the upper surface of the oxide semiconductor layer 735. In some implementations, the oxide semiconductor layer 735 can be graded in a reverse manner relative to the oxide semiconductor layer 635 for the TFT device 600 in FIG. 6. Hence, the oxide semiconductor layer 735 can have high electron mobility for high electric characteristics at an interface between the upper surface of the oxide semiconductor layer 735 and the gate insulator 725, and low electron mobility for stability at an interface between the lower surface of the oxide semiconductor layer 735 and the substrate 705.

Figure 8:
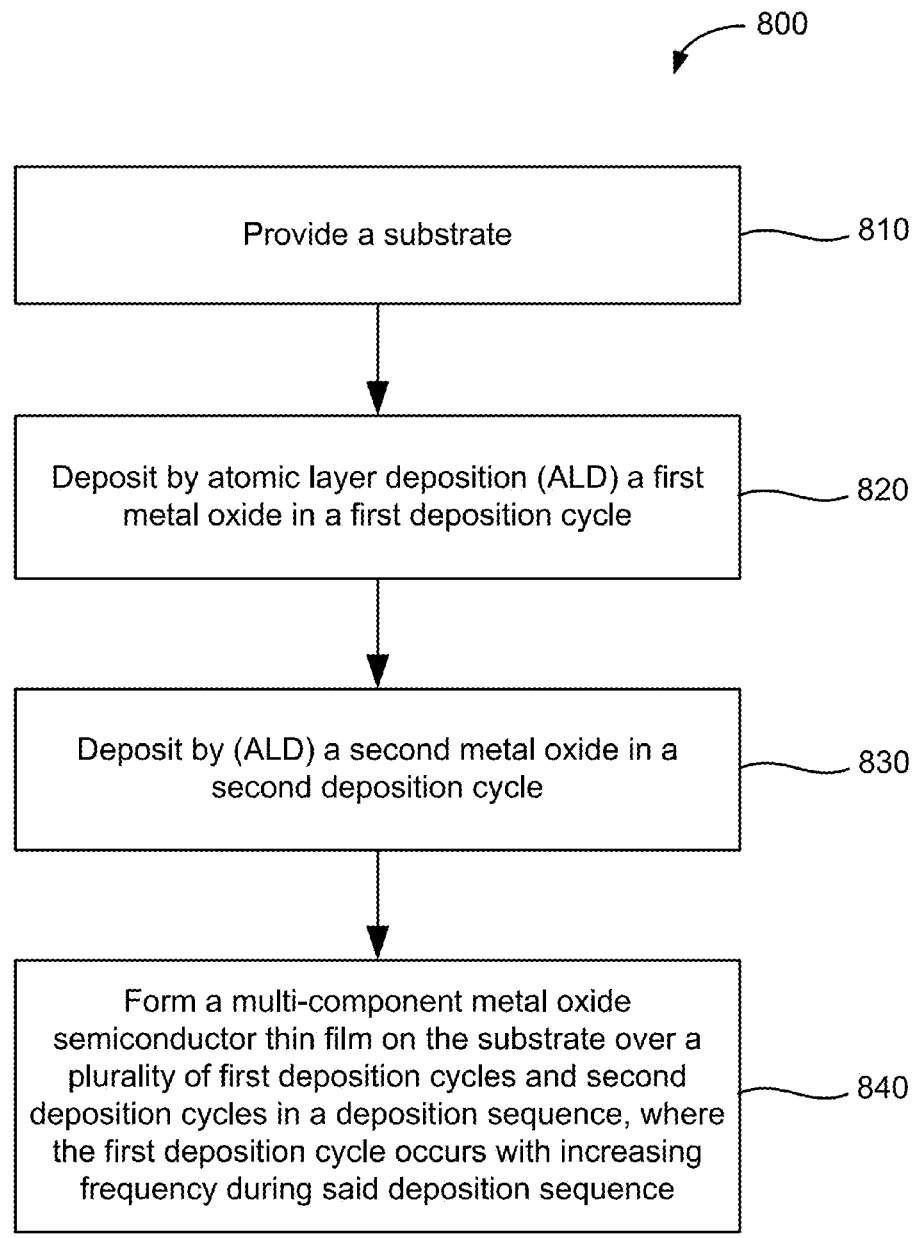
FIG. 8 shows an example of a flow diagram illustrating a method of manufacturing a multi-component metal oxide semiconductor thin film.

FIG. 8 shows an example of a flow diagram illustrating a method of manufacturing a manufacturing a multi-component metal oxide semiconductor thin film. It will be understood that additional and optional processes may be present.

The process 800 begins at block 810 where a substrate is provided. The substrate can be made of a non-crystalline (such as amorphous) material, including but not limited to glass, spin-on glass, plastic, polymers, and thermal oxides. In some implementations, the substrate can include a crystalline bulk material with a coating of non-crystalline material. Glass substrates may include a borosilicate glass, a soda lime glass, photoglass, quartz, Pyrex, or other suitable glass material. In some implementations, the substrate includes a source region, a channel region, and a drain region. In some implementations, the substrate on which a TFT device is formed has dimensions of a few microns to hundreds of microns.

In some implementations, the substrate may be pre-patterned. As described earlier herein, the substrate may be pre-patterned with a hydrophobic photoresist having one or more openings that expose portions of the substrate. The exposed portions of the substrate enable self-aligned deposition of one or more islands of metal oxide layers. Such islands of metal oxide layers may be components of a TFT, such as an oxide semiconductor layer of a TFT.

The process 800 continues at block 820, where a first metal oxide is deposited by ALD in a first deposition cycle. In some implementations, depositing the first metal oxide by ALD includes pulsing a first metal precursor over the substrate and pulsing an oxidant precursor over the first metal precursor to form the first metal oxide. In some implementations, the first metal precursor can include one of an aluminum-containing precursor, a germanium-containing precursor, a hafnium-containing precursor, and a gallium-containing precursor. The oxidant precursor can include any appropriate oxidizing agent, such as water vapor. In some implementations, purge gas may be introduced to remove excess precursors and gaseous byproducts after pulsing the first metal precursor and also after pulsing the oxidant precursor. In some implementations, a plasma may be used to energize a reaction between the first metal precursor and the oxidant precursor to form the first metal oxide.

The process 800 continues at block 830, where a second metal oxide is deposited by ALD in a second deposition cycle. In some implementations, depositing the second metal oxide by ALD includes pulsing a second metal precursor over the substrate and pulsing an oxidant precursor over the second metal precursor to form the second metal oxide. In some implementations, the second metal precursor can include one of an indium-containing precursor and a zinc-containing precursor. The oxidant precursor can include any appropriate oxidizing agent, such as water vapor. In some implementations, purge gas may be introduced to remove excess precursors and gaseous byproducts after pulsing the second metal precursor and also after pulsing the oxidant precursor. In some implementations, a plasma may be used to energize a reaction between the second metal precursor and the oxidant precursor to form the second metal oxide.

In some implementations, the first metal oxide and the second metal oxide each can include at least one of Al, Cu, Zn, Ga, Ge, As, Ag, Cd, In, Sn, Sb, Au, Hg, Ti, Pb, Bi, and Hf. In some implementations, block 830 can be performed prior to block 820.

The process 800 continues at block 840, where a multi-component metal oxide semiconductor thin film is formed over a plurality of first deposition cycles and second deposition cycles in a deposition sequence, where the first deposition cycles occur with increasing frequency during the deposition sequence. Increasing the frequency of the first deposition cycles over the course of the deposition sequence can lead to a graded thin film, where the concentration of the first metal oxide is greater near the upper surface of the thin film than near the lower surface of the thin film.

In some implementations, the process 800 can further include depositing by ALD a third metal oxide in a third deposition cycle. Hence, forming the multi-component metal oxide semiconductor thin film on the substrate occurs over a plurality of first deposition cycles, second deposition cycles, and third deposition cycles in a deposition sequence. The frequency of one or more of the first, second, and third deposition cycles can vary as the deposition of the multi-component metal oxide semiconductor thin film proceeds to form a graded film. Additional components of the multi-component metal oxide thin film may be added in a similar fashion.

TFT devices may be associated with EMS devices such as IMOD display devices. For example, in some implementations, an IMOD pixel can be connected to and configured to be individually addressed by a TFT switching device.

Figure 9A:
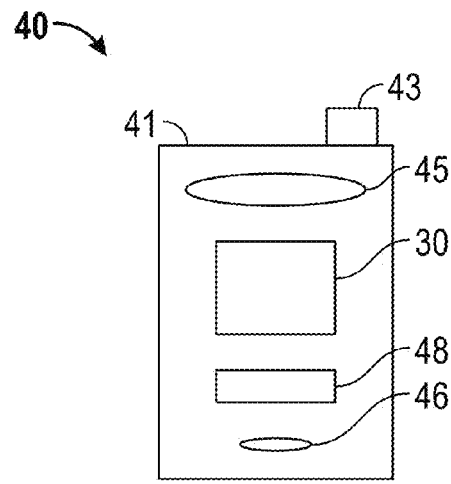
FIGS. 9A and 9B are system block diagrams illustrating a display device that includes a plurality of IMOD display elements.
Figure 9B:
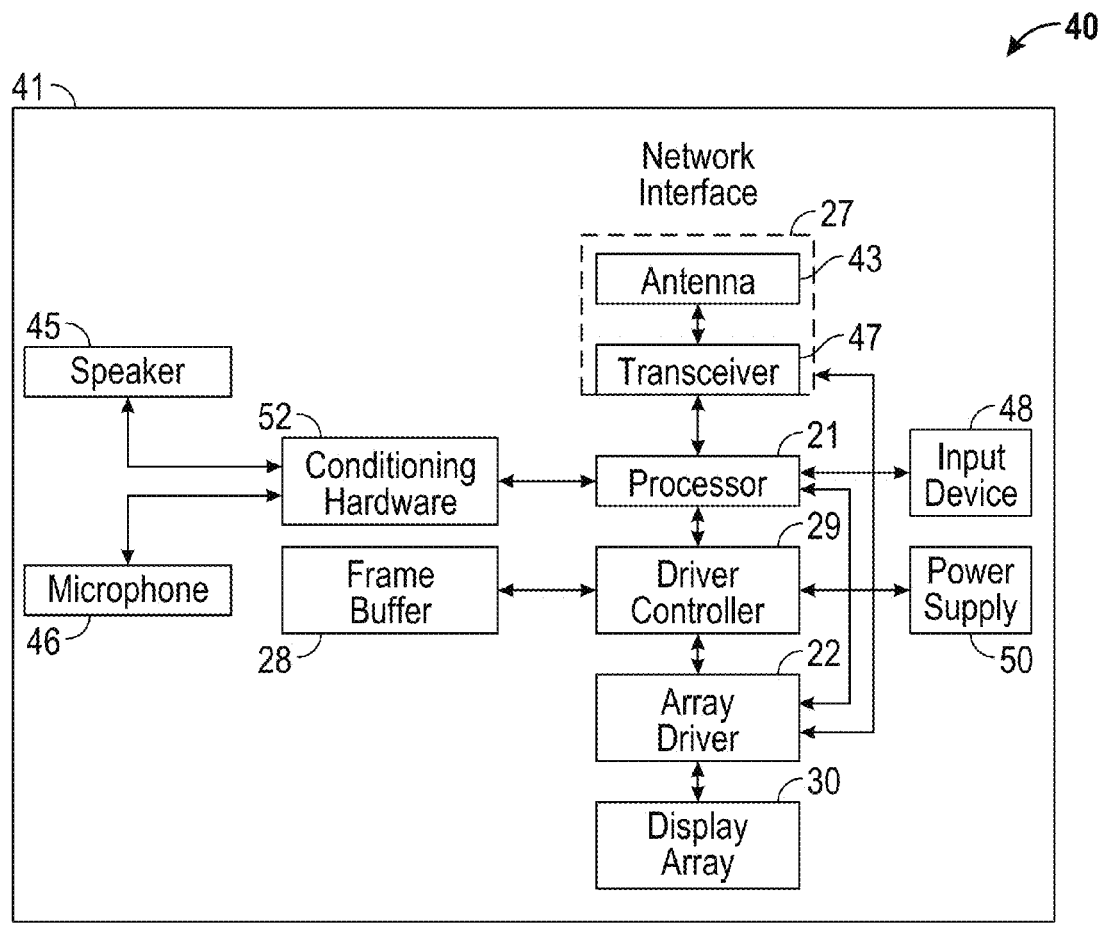

FIGS. 9A and 9B are system block diagrams illustrating a display device 40 that includes a plurality of IMOD display elements. The display device 40 can be, for example, a smart phone, a cellular or mobile telephone. However, the same components of the display device 40 or slight variations thereof are also illustrative of various types of display devices such as televisions, computers, tablets, e-readers, hand-held devices and portable media devices.

The display device 40 includes a housing 41, a display 30, an antenna 43, a speaker 45, an input device 48 and a microphone 46. The housing 41 can be formed from any of a variety of manufacturing processes, including injection molding, and vacuum forming. In addition, the housing 41 may be made from any of a variety of materials, including, but not limited to: plastic, metal, glass, rubber and ceramic, or a combination thereof. The housing 41 can include removable portions (not shown) that may be interchanged with other removable portions of different color, or containing different logos, pictures, or symbols.

The display 30 may be any of a variety of displays, including a bi-stable or analog display, as described herein. The display 30 also can be configured to include a flat-panel display, such as plasma, EL, OLED, STN LCD, or TFT LCD, or a non-flat-panel display, such as a CRT or other tube device. In addition, the display 30 can include an IMOD-based display, as described herein.

The components of the display device 40 are schematically illustrated in FIG. 9A. The display device 40 includes a housing 41 and can include additional components at least partially enclosed therein. For example, the display device 40 includes a network interface 27 that includes an antenna 43 which can be coupled to a transceiver 47. The network interface 27 may be a source for image data that could be displayed on the display device 40. Accordingly, the network interface 27 is one example of an image source module, but the processor 21 and the input device 48 also may serve as an image source module. The transceiver 47 is connected to a processor 21, which is connected to conditioning hardware 52. The conditioning hardware 52 may be configured to condition a signal (such as filter or otherwise manipulate a signal). The conditioning hardware 52 can be connected to a speaker 45 and a microphone 46. The processor 21 also can be connected to an input device 48 and a driver controller 29. The driver controller 29 can be coupled to a frame buffer 28, and to an array driver 22, which in turn can be coupled to a display array 30. One or more elements in the display device 40, including elements not specifically depicted in FIG. 9A, can be configured to function as a memory device and be configured to communicate with the processor 21. In some implementations, a power supply 50 can provide power to substantially all components in the particular display device 40 design.

The network interface 27 includes the antenna 43 and the transceiver 47 so that the display device 40 can communicate with one or more devices over a network. The network interface 27 also may have some processing capabilities to relieve, for example, data processing requirements of the processor 21. The antenna 43 can transmit and receive signals. In some implementations, the antenna 43 transmits and receives RF signals according to the IEEE 16.11 standard, including IEEE 16.11(a), (b), or (g), or the IEEE 802.11 standard, including IEEE 802.11a, b, g, n, and further implementations thereof. In some other implementations, the antenna 43 transmits and receives RF signals according to the Bluetooth® standard. In the case of a cellular telephone, the antenna 43 can be designed to receive code division multiple access (CDMA), frequency division multiple access (FDMA), time division multiple access (TDMA), Global System for Mobile communications (GSM), GSM/General Packet Radio Service (GPRS), Enhanced Data GSM Environment (EDGE), Terrestrial Trunked Radio (TETRA), Wideband-CDMA (W-CDMA), Evolution Data Optimized (EV-DO), 1xEV-DO, EV-DO Rev A, EV-DO Rev B, High Speed Packet Access (HSPA), High Speed Downlink Packet Access (HSDPA), High Speed Uplink Packet Access (HSUPA), Evolved High Speed Packet Access (HSPA+), Long Term Evolution (LTE), AMPS, or other known signals that are used to communicate within a wireless network, such as a system utilizing 3G, 4G or 5G technology. The transceiver 47 can preprocess the signals received from the antenna 43 so that they may be received by and further manipulated by the processor 21. The transceiver 47 also can process signals received from the processor 21 so that they may be transmitted from the display device 40 via the antenna 43.

In some implementations, the transceiver 47 can be replaced by a receiver. In addition, in some implementations, the network interface 27 can be replaced by an image source, which can store or generate image data to be sent to the processor 21. The processor 21 can control the overall operation of the display device 40. The processor 21 receives data, such as compressed image data from the network interface 27 or an image source, and processes the data into raw image data or into a format that can be readily processed into raw image data. The processor 21 can send the processed data to the driver controller 29 or to the frame buffer 28 for storage. Raw data typically refers to the information that identifies the image characteristics at each location within an image. For example, such image characteristics can include color, saturation and gray-scale level.

The processor 21 can include a microcontroller, CPU, or logic unit to control operation of the display device 40. The conditioning hardware 52 may include amplifiers and filters for transmitting signals to the speaker 45, and for receiving signals from the microphone 46. The conditioning hardware 52 may be discrete components within the display device 40, or may be incorporated within the processor 21 or other components.

The driver controller 29 can take the raw image data generated by the processor 21 either directly from the processor 21 or from the frame buffer 28 and can re-format the raw image data appropriately for high speed transmission to the array driver 22. In some implementations, the driver controller 29 can re-format the raw image data into a data flow having a raster-like format, such that it has a time order suitable for scanning across the display array 30. Then the driver controller 29 sends the formatted information to the array driver 22. Although a driver controller 29, such as an LCD controller, is often associated with the system processor 21 as a stand-alone Integrated Circuit (IC), such controllers may be implemented in many ways. For example, controllers may be embedded in the processor 21 as hardware, embedded in the processor 21 as software, or fully integrated in hardware with the array driver 22.

The array driver 22 can receive the formatted information from the driver controller 29 and can re-format the video data into a parallel set of waveforms that are applied many times per second to the hundreds, and sometimes thousands (or more), of leads coming from the display's x-y matrix of display elements.

In some implementations, the driver controller 29, the array driver 22, and the display array 30 are appropriate for any of the types of displays described herein. For example, the driver controller 29 can be a conventional display controller or a bi-stable display controller (such as an IMOD display element controller). Additionally, the array driver 22 can be a conventional driver or a bi-stable display driver (such as an IMOD display element driver). Moreover, the display array 30 can be a conventional display array or a bi-stable display array (such as a display including an array of IMOD display elements). In some implementations, the driver controller 29 can be integrated with the array driver 22. Such an implementation can be useful in highly integrated systems, for example, mobile phones, portable-electronic devices, watches or small-area displays.

In some implementations, the input device 48 can be configured to allow, for example, a user to control the operation of the display device 40. The input device 48 can include a keypad, such as a QWERTY keyboard or a telephone keypad, a button, a switch, a rocker, a touch-sensitive screen, a touch-sensitive screen integrated with the display array 30, or a pressure- or heat-sensitive membrane. The microphone 46 can be configured as an input device for the display device 40. In some implementations, voice commands through the microphone 46 can be used for controlling operations of the display device 40.

The power supply 50 can include a variety of energy storage devices. For example, the power supply 50 can be a rechargeable battery, such as a nickel-cadmium battery or a lithium-ion battery. In implementations using a rechargeable battery, the rechargeable battery may be chargeable using power coming from, for example, a wall socket or a photovoltaic device or array. Alternatively, the rechargeable battery can be wirelessly chargeable. The power supply 50 also can be a renewable energy source, a capacitor, or a solar cell, including a plastic solar cell or solar-cell paint. The power supply 50 also can be configured to receive power from a wall outlet.

In some implementations, control programmability resides in the driver controller 29 which can be located in several places in the electronic display system. In some other implementations, control programmability resides in the array driver 22. The above-described optimization may be implemented in any number of hardware and/or software components and in various configurations.

As used herein, a phrase referring to "at least one of" a list of items refers to any combination of those items, including single members. As an example, "at least one of: a, b, or c" is intended to cover: a, b, c, a-b, a-c, b-c, and a-b-c.

The various illustrative logics, logical blocks, modules, circuits and algorithm steps described in connection with the implementations disclosed herein may be implemented as electronic hardware, computer software, or combinations of both. The interchangeability of hardware and software has been described generally, in terms of functionality, and illustrated in the various illustrative components, blocks, modules, circuits and steps described above. Whether such functionality is implemented in hardware or software depends upon the particular application and design constraints imposed on the overall system.

The hardware and data processing apparatus used to implement the various illustrative logics, logical blocks, modules and circuits described in connection with the aspects disclosed herein may be implemented or performed with a general purpose single- or multi-chip processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general purpose processor may be a microprocessor, or, any conventional processor, controller, microcontroller, or state machine. A processor also may be implemented as a combination of computing devices, such as a combination of a DSP and a microprocessor, a plurality of microprocessors, one or more microprocessors in conjunction with a DSP core, or any other such configuration. In some implementations, particular steps and methods may be performed by circuitry that is specific to a given function.

In one or more aspects, the functions described may be implemented in hardware, digital electronic circuitry, computer software, firmware, including the structures disclosed in this specification and their structural equivalents thereof, or in any combination thereof. Implementations of the subject matter described in this specification also can be implemented as one or more computer programs, i.e., one or more modules of computer program instructions, encoded on a computer storage media for execution by, or to control the operation of, data processing apparatus.

Various modifications to the implementations described in this disclosure may be readily apparent to those skilled in the art, and the generic principles defined herein may be applied to other implementations without departing from the spirit or scope of this disclosure. Thus, the claims are not intended to be limited to the implementations shown herein, but are to be accorded the widest scope consistent with this disclosure, the principles and the novel features disclosed herein. Additionally, a person having ordinary skill in the art will readily appreciate, the terms "upper" and "lower" are sometimes used for ease of describing the figures, and indicate relative positions corresponding to the orientation of the figure on a properly oriented page, and may not reflect the proper orientation of, e.g., an IMOD display element as implemented.

Certain features that are described in this specification in the context of separate implementations also can be implemented in combination in a single implementation. Conversely, various features that are described in the context of a single implementation also can be implemented in multiple implementations separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, a person having ordinary skill in the art will readily recognize that such operations need not be performed in the particular order shown or in sequential order, or that all illustrated operations be performed, to achieve desirable results. Further, the drawings may schematically depict one more example processes in the form of a flow diagram. However, other operations that are not depicted can be incorporated in the example processes that are schematically illustrated. For example, one or more additional operations can be performed before, after, simultaneously, or between any of the illustrated operations. In certain circumstances, multitasking and parallel processing may be advantageous. Moreover, the separation of various system components in the implementations described above should not be understood as requiring such separation in all implementations, and it should be understood that the described program components and systems can generally be integrated together in a single software product or packaged into multiple software products. Additionally, other implementations are within the scope of the following claims. In some cases, the actions recited in the claims can be performed in a different order and still achieve desirable results.

What is claimed is:

1. A thin film transistor (TFT) device, comprising:
    a gate;
    an active layer having a source region, a drain region, and a channel region, wherein the channel region is between the source region and the drain region, and wherein the active layer includes a plurality of sublayers of a first metal oxide and a plurality of sublayers of a second metal oxide in a stacked arrangement from a first surface to a second surface of the active layer, wherein the arrangement includes an upper portion and a lower portion, the upper portion having at least one second metal oxide sublayer and a greater number of sublayers of the first metal oxide than the second metal oxide, and the lower portion having at least one first metal oxide sublayer and a greater number of sublayers of the second metal oxide than the first metal oxide;
    a gate insulator between the active layer and the gate;
    a source metal adjacent to the source region of the active layer; and
    a drain metal adjacent to the drain region of the active layer.

2. The TFT device of claim 1, wherein the gate is over the gate insulator and the active layer is below the gate insulator.

3. The TFT device of claim 1, wherein the gate is below the gate insulator and the active layer is over the gate insulator.

4. The TFT device of claim 1, wherein the active layer substantially includes a substantially semiconducting metal oxide proximate the interface between the active layer and the gate insulator.

5. The TFT device of claim 1, wherein the active layer substantially includes a substantially insulating metal oxide proximate a surface of the active layer facing away from the gate.

6. The TFT device of claim 1, wherein the active layer includes indium-gallium-zinc-oxide (IGZO).

7. The TFT device of claim 6, wherein the concentration of gallium oxide increases from a surface of the active layer facing away from the gate to a surface of the active layer facing towards from the gate.

8. The TFT device of claim 7, wherein the concentration of gallium oxide is less than about 5% at the surface of the active layer facing away from the gate and greater than about 95% at the surface of the active layer facing towards the gate.

9. The TFT device of claim 1, wherein the active layer is less than about 100 Å in thickness.

10. The TFT device of claim 1, wherein the active layer is amorphous.

11. The TFT device of claim 1, wherein one of the two metal oxides includes at least one of gallium oxide, aluminum oxide, hafnium oxide, and germanium oxide.

12. The TFT device of claim 1, wherein one of the two metal oxides includes at least one of indium oxide and zinc oxide.

13. The TFT device of claim 1, wherein the active layer is formed on a substrate, and wherein the substrate includes glass or plastic.

14. An apparatus comprising:
    the TFT device of claim 1;
    a display;
    a processor that is configured to communicate with the display, the processor being configured to process image data; and
    a memory device that is configured to communicate with the processor.

15. The apparatus of claim 14, further comprising:
a driver circuit configured to send at least one signal to the TFT device in electrical communication with the display; and
a controller configured to send at least a portion of the image data to the driver circuit.

16. The apparatus of claim 14, further comprising:
an image source module configured to send the image data to the processor, wherein the image source module comprises at least one of a receiver, transceiver, and transmitter; and
an input device configured to receive input data and to communicate the input data to the processor.

17. An apparatus, comprising:
a substrate; and
a thin film transistor (TFT) over the substrate, the TFT comprising:
a gate metal over the substrate;
a dielectric layer over the substrate and the gate metal;
an oxide semiconductor layer over the dielectric layer, wherein the oxide semiconductor layer has a source region, a drain region, and a channel region, wherein the channel region is between the source region and the drain region, and wherein the oxide semiconductor layer includes a plurality of sublayers of a first metal oxide and a plurality of sublayers of a second metal oxide in a stacked arrangement from a first surface to a second surface of the active layer, wherein the arrangement includes an upper portion and a lower portion, the upper portion having at least one second metal oxide sublayer and a greater number of sublayers of the first metal oxide than the second metal oxide, and the lower portion having at least one first metal oxide sublayer and a greater number of sublayers of the second metal oxide than the first metal oxide;
a source metal adjacent to the source region of the oxide semiconductor layer; and
a drain metal adjacent to the drain region of the oxide semiconductor layer.

18. The apparatus of claim 17, wherein the oxide semiconductor layer substantially includes a substantially semiconducting metal oxide proximate the lower surface of the oxide semiconductor layer.

19. The apparatus device of claim 17, wherein the oxide semiconductor layer includes indium-gallium-zinc-oxide (IGZO).

20. The apparatus of claim 17, wherein the oxide semiconductor layer is less than about 100 Å in thickness.

21. An apparatus, comprising:
a substrate; and
a thin film transistor (TFT) over the substrate, the TFT comprising:
an oxide semiconductor layer over the substrate, wherein the oxide semiconductor layer has a source region, a drain region, and a channel region, wherein the channel region is between the source region and the drain region, and wherein the oxide semiconductor layer includes a plurality of sublayers of a first metal oxide and a plurality of sublayers of a second metal oxide in a stacked arrangement from a first surface to a second surface of the oxide semiconductor layer, wherein the arrangement includes an upper portion and a lower portion, the upper portion having at least one second metal oxide sublayer and a greater number of sublayers of the first metal oxide than the second metal oxide, and the lower portion having at least one first metal oxide sublayer and a greater number of sublayers of the second metal oxide than the first metal oxide;
a dielectric layer over the channel region of the oxide semiconductor layer;
a gate metal over the dielectric layer;
a source metal adjacent to the source region of the oxide semiconductor layer; and
a drain metal adjacent to the drain region of the oxide semiconductor layer.

22. The apparatus of claim 21, wherein the oxide semiconductor layer substantially includes a substantially semiconducting metal oxide proximate the upper surface of the oxide semiconductor layer.

23. The apparatus device of claim 21, wherein the oxide semiconductor layer includes indium-gallium-zinc-oxide (IGZO).

24. The apparatus of claim 21, wherein the oxide semiconductor layer is less than about 100 Å in thickness.

* * * * *